United States Patent [19]
Fujimura et al.

[11] Patent Number: 5,595,916
[45] Date of Patent: Jan. 21, 1997

[54] SILICON OXIDE FILM EVALUATION METHOD

[75] Inventors: Shuzo Fujimura; Hiroki Ogawa; Kenji Ishikawa; Carlos R. Inomata, all of Kawasaki, Japan

[73] Assignee: Fujitsu Limited, Kawasaki, Japan

[21] Appl. No.: 219,550

[22] Filed: Mar. 29, 1994

[30] Foreign Application Priority Data

Mar. 29, 1993 [JP] Japan .................................. 5-070527
Mar. 29, 1993 [JP] Japan .................................. 5-070528

[51] Int. Cl.$^6$ .................................................. H01L 21/66
[52] U.S. Cl. .......................................... 437/8; 250/341.4
[58] Field of Search ............................. 437/8, 7, 173; 250/339.08, 339.11, 341.4

[56] References Cited

U.S. PATENT DOCUMENTS

| | | | |
|---|---|---|---|
| 4,332,833 | 6/1982 | Aspnes et al. | 437/8 |
| 4,590,574 | 5/1986 | Edmonds et al. | 250/339.08 |
| 4,862,000 | 8/1989 | Kubota et al. | 250/341.4 |
| 5,066,599 | 11/1991 | Kaneta et al. | 437/7 |
| 5,107,119 | 4/1992 | Kimura et al. | 250/341.4 |
| 5,273,617 | 12/1993 | Fathauer et al. | 437/200 |

FOREIGN PATENT DOCUMENTS

| | | | |
|---|---|---|---|
| 56-94243 | 7/1981 | Japan | 250/341.4 |
| 61-79142 | 4/1986 | Japan | 250/339.11 |

OTHER PUBLICATIONS

B. Garrido et al., Appl. Surf. Sci, 56–58(1992)861 ". . . Si/SiO$_2$ interfaces Analyzed By Infrared Spectroscopy".
T. Hattori, Thin Solid Films, 206(1991) "Silicon Oxide Films And The Oxide–Silicon Interface".
S. Wolf & R. N. Tauber, "Silicon Processing For the VLSI ERA" vol. I, 1986, pp. 19–21, 150–1,175,198,251.
S. M. Hu, J. Appl. Phys., 51(11) (1980)5945, "IR Absorption Spectra of SiO$_2$ Precipitates . . . ".
H. Ogawa et al., Appl. Surf. Sci., 56–58(1992)836 "Si–H Bonds in Silicon Oxide Near The SiO$_2$/Si Interface".
E. Glaser et al., Phys. Rev. B, 37,18(1988)10769 "Far Infrared . . . Studies of Oxide Charge Induced . . . ".
Y. Nagasawa et al., J. Appl. Phys., 68,4 (1990)1429 "The Study of Thermal Oxide Films . . . By FT–IR–ATR".
F. Shimura et al., Appl. Phys. Lett., 38,11(1981)867 ". . . Interstitial Oxygen in Annealed CZ Si . . . ".
K. Ishikawa, et al., Control of Semic. Interfaces Symp. Proc., "FT–IR–RAS Analysis of the Structure of the SiO$_2$/Si Interface" Jun. 1994.
T. Suzuki, et al., Jpn. J. Appl. Phys., 25(4)(1986)544, "Depth Profiling of the Si–SiO$_2$ Interface Structures" Apr. 1986.
R. A. B. Devine, et al., MRS Symp. Proc. '93, vol. 318 p. 623, "Near Interface . . . Si/SiO$_2$/Si Structures" Nov. 1993.
P. Grosse et al., Appl. Phys. A, 39(1986)257, "IR Spectroscopy of Oxide Layers . . . " Apr. 1986.
Y. Matsui, et al., Jpn. J. Appl. Phys., 31(2a)(1992)369, ". . . IR Characterization of Ultrathin SiO$_2$ Film by Grazing Internal Reflection . . . " Feb. 1992.
R. Brendel, Appl. Phys. A, 50 (1990) 587, "Quantitative IR Study of Ultrathin MIS Structures by Grazing Internal Reflection" May 1990.

*Primary Examiner*—Charles L. Bowers, Jr.
*Assistant Examiner*—Leon Radomsky
*Attorney, Agent, or Firm*—Nikaido, Marmelstein, Murray & Oram LLP

[57] ABSTRACT

In a silicon oxide film evaluation method for evaluating the silicon oxide film formed on a silicon substrate, radiation of a plurality of incident angles is irradiated to the silicon oxide film, reflected radiation of the radiation of the plural incident angles on the silicon oxide film is measured, reflectances for the radiation of the plural incident angles is computed, based on the radiation of the plural incident angles and reflected radiation thereof, a dielectric function is computed, based on the reflectances for the plural incident angles, and film quality of the silicon oxide film is evaluated, based on the dielectric function. The silicon oxide film evaluation method and apparatus can evaluate film quality of the silicon oxide film formed on the silicon substrate in non-contact and non-destructively.

17 Claims, 21 Drawing Sheets

Native oxides

Native oxide substraction

Thermal oxides

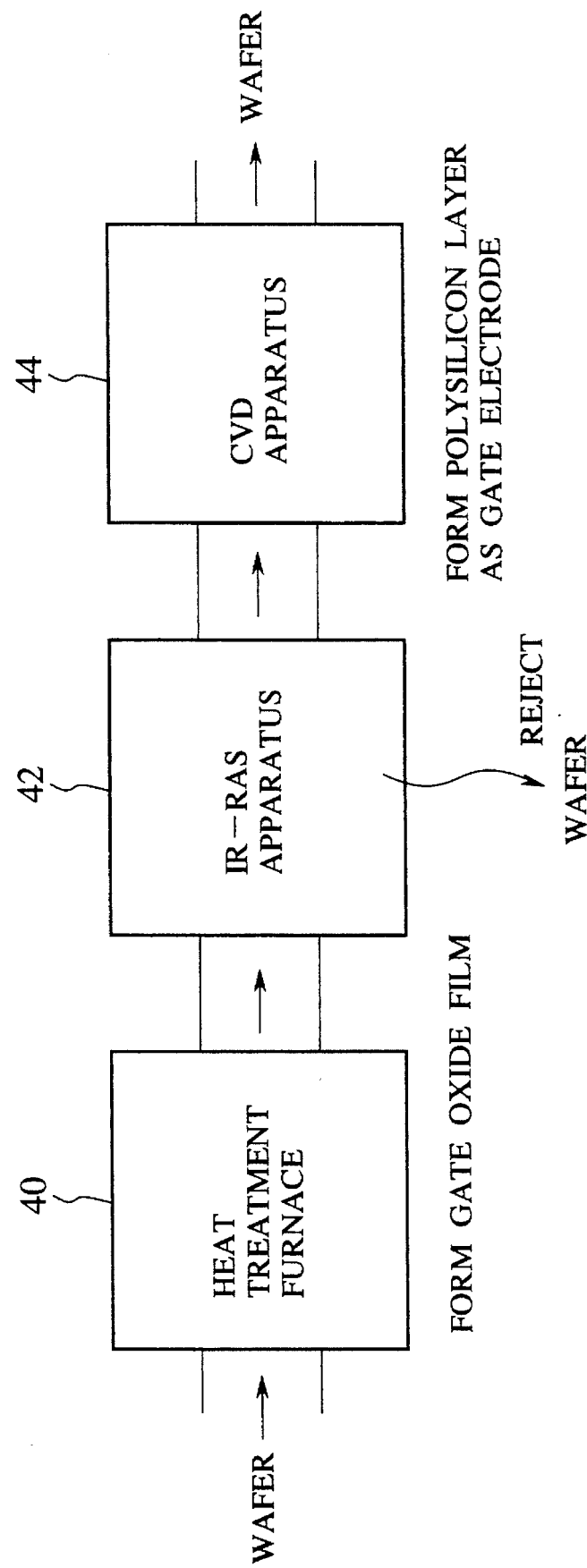

SILICON OXIDE FILM EVALUATION METHOD

BACKGROUND OF THE INVENTION

The present invention relates to a silicon oxide film evaluation method and apparatus for evaluating silicon oxide films formed on silicon substrates, and a semiconductor device fabrication method and apparatus using the evaluation method.

Silicon semiconductor devices, such as bipolar transistors, MOSFETs memory devices, etc., use as their insulating films silicon oxide films formed on silicon substrates by thermal oxidation. Among the silicon oxide films formed by thermal oxidation, field insulating films for device isolation are thick, but silicon oxide films used as gate insulating films and dielectric films of trench capacitors are very thin. But these thin films are required to be thinner as the semiconductor devices are more dense.

A film thickness of a thin oxide film of below about 10 nm formed by thermal oxidation corresponds to tens of atomic layers in terms of atomic layer. Accordingly it is preferred that film quality evaluation of the silicon oxide film is conducted by physico-chemical structural analyses, which are conducted on the atomic and molecular levels.

But the conventional evaluation method cannot evaluate silicon oxide films non-destructively and has to evaluate them based on electric characteristics of the semiconductor device. Electric characteristics of a semiconductor device is much influenced not only by thermal oxidation, but also by fabrication processing, such as electrodes formation, heat treatments, etc., which follows the thermal oxidation. For this reason it is impossible to correctly determine thermal oxidation conditions based on electric characteristics of a semiconductor device, and to determine proper thermal oxidation conditions, inefficiently trials and errors have to be repeated. This is a problem of inefficiency.

As methods for directly observing surface and interface states of semiconductor devices, atomic absorption spectrometry, Auger electron spectroscopies, infrared spectroscopic analysis, transmission electron microscopes, scanning tunneling electron microscopes, scanning atomic force microscopes, etc. are known.

In observations by atomic absorption spectrometry, Auger electron spectroscopies, infrared spectroscopic analysis, transmission electron microscopes, scanning tunneling electron microscopes, scanning atomic force microscopes, etc., samples have to be placed in a vacuum, and are broken. Accordingly semiconductor substrates under fabrication cannot be directly observed. It is necessary to put aside semiconductor substrates under fabrication for samples for the observation.

But actually surface states of the samples do not agree with those of the semiconductor substrates under fabrication for semiconductor circuits to be formed on. As a result, observation errors occur. It is necessary to secure a space for the samples in a semiconductor fabrication apparatus. As a result fabrication efficiency is lowered, and time and labor are needed. This is also a problem.

But infrared absorption analysis is a non-contact, non-destructive observation method and can be conducted in the normal atmospheric pressure. Because of these characteristics, infrared absorption analysis enables the semiconductor substrates of semiconductor devices under fabrication to be directly observed.

An object of the present invention is to provide a silicon oxide film evaluation method and apparatus which enable silicon oxide films formed on silicon substrates to be non-destructively observed in non-contact for evaluation.

Another object of the represent invention is to provide a semiconductor device fabrication method and apparatus which enables silicon oxide films formed on silicon substrates to be observed in line.

SUMMARY OF THE INVENTION

The object of the present invention is achieved by a silicon oxide film evaluation method for evaluating film quality of a silicon oxide film formed on a silicon substrate, the method comprising the steps of: irradiating radiation of a plurality of incident angles to the silicon oxide film; measuring reflected radiation of the radiation of the plural incident angles on the silicon oxide film; computing reflectances for the radiation of the plural incident angles respectively, based on the radiation of the plural incident angles and reflected radiation of a plurality of reflection angles, and computing a dielectric function of the silicon oxide film, based on the reflectances for the radiation of the plural incident angles; and evaluating film quality of the silicon oxide film, based on the dielectric function.

In the silicon oxide film evaluation method, it is preferable that the plural incident angles is an angle larger than the Brewster angle and an angle smaller than the Brewster angle.

In the silicon oxide film evaluation method, it is preferable that the method further comprises the steps of: computing a dielectric function of a reference silicon oxide film of film quality which is a reference for the silicon oxide film to be evaluated formed on the silicon substrate; computing a dielectric function of the silicon oxide film to be evaluated; and comparing the dielectric function of the reference silicon oxide film, and the dielectric function of the silicon oxide film to be evaluated to evaluate film quality of the silicon oxide film to be evaluated.

In the silicon oxide film evaluation method, it is preferable that the method further comprises the steps of: computing a dielectric function of a reference silicon oxide film of a thickness which is a reference for the silicon oxide film to be evaluated formed on the silicon substrate; measuring reflectances of the silicon oxide film to be evaluated; estimating reflectances of the silicon oxide film to be evaluated to compute estimated reflectances, based on the dielectric function of the reference silicon oxide film, and a film thickness of the silicon oxide film to be evaluated; and comparing the measured reflectances of the silicon oxide film to be evaluated with the estimated reflectances to evaluate film quality of the silicon oxide film to be evaluated.

The object of the present invention is achieved by a silicon oxide film evaluation method for evaluating a silicon oxide film formed on a silicon substrate, an interface of the silicon oxide film being evaluated, based on an absorbance or a reflectance of incident radiation in a 1100–1230 $cm^{-1}$ wave number range.

In the silicon oxide film evaluation method, it is preferable that a silicon oxide film formed on a surface of the silicon substrate opposite to a surface where the silicon oxide film to be evaluated is formed on is removed beforehand.

In the silicon oxide film evaluation method, it is preferable that an infrared absorbing region for absorbing infrared radiation is provided in the silicon substrate.

In the silicon oxide film evaluation method, it is preferable that the silicon substrate has a thickness above a set thickness which keeps the reflected radiation on the surface of the silicon substrate with the silicon oxide film to be evaluated, from influence of the reflected radiation on a surface of the silicon substrate opposed to the surface.

In the silicon oxide film evaluation method, it is preferable that a model is set, in which a mixed layer where silicon particles and silicon oxide particles are mixed is present on an interface between the silicon substrate and the silicon oxide film, and a dielectric function of the mixed layer is given by effective medium theory, and the dielectric function of the silicon oxide film computed based on the reflectances are agreed with the model.

The object of the present invention is achieved by a silicon oxide film evaluation apparatus for evaluating film quality of silicon oxide film formed on a silicon substrate, the apparatus comprising: irradiating means for applying radiation of a plurality of incident angles to the silicon oxide film; measuring means for measuring reflected radiation on the silicon oxide film for the plural incident angles; and computing means for computing reflectances for the radiation of the plural incident angles respectively, based on the radiation of the plural incident angles and reflected radiation for the plural incident angles, and computing dielectric function, based on the reflectances for the plural incident angles.

The object of the present invention is achieved by a semiconductor device fabrication method comprising a step of evaluating a silicon oxide film by the above-described silicon oxide film evaluation method.

The object of the present invention is achieved by a semiconductor device fabrication method comprising the steps of: forming a silicon oxide film on a silicon substrate by thermal oxidation; evaluating the silicon oxide film formed on the silicon substrate by the above-described silicon oxide film evaluation method; and depositing a polycrystal silicon layer on the silicon oxide film.

The object of the present invention is achieved by a semiconductor device fabrication apparatus comprising: a heat treatment apparatus for forming a silicon oxide film on a silicon substrate by heat oxidation; an evaluation apparatus arranged so as to conduct processing on line with the heat treatment apparatus for evaluating the silicon oxide film by the above-described silicon oxide film evaluation method; and a CVD apparatus arranged so as to conduct processing on line with the evaluation apparatus for depositing a polycrystal silicon on the silicon oxide film.

In the silicon oxide film evaluation method for evaluating film quality of a silicon oxide film formed on a silicon substrate according to the present invention, radiation of different incident angles are applied to a silicon oxide film, reflected radiation on the silicon oxide film for the plural incident angles is measured, reflectances are computed respectively for the radiation of the plural incident angles, based on the radiation of the plural incident angles and the reflected radiation corresponding to the incident angles, a dielectric constant of the silicon oxide film is computed based on the reflectances for the plural incident angles, and film quality of the silicon oxide film is evaluated based on the dielectric constant, whereby film quality of the silicon oxide film formed on the silicon substrate can be evaluated in non-contact and non-destructively.

According to the present invention, a dielectric constant of a reference silicon oxide film of film quality which is a reference for evaluation of film quality of a silicon oxide film formed on a silicon substrate is given, a dielectric constant of the silicon oxide film to be evaluated is given, and the dielectric function of the reference silicon oxide film and that of the silicon oxide film to be evaluated are compared to evaluate film quality of the silicon oxide film to be evaluated, whereby the silicon oxide film formed on the silicon substrate can be observed in non-contact and non-destructively to evaluate its film quality.

In the silicon oxide film evaluation method according to the present invention, an interface of a silicon oxide film is evaluated based on absorbances or reflectances of incident radiation of a 1100–1230 $cm^{-1}$ wave number range, whereby an interface of the silicon oxide film can be correctly evaluated.

According to the present invention, an infrared absorbing region for absorbing infrared radiation is provided in a silicon substrate, whereby the evaluation is free from influence by reflected radiation on the bottom of the silicon substrate.

According to the present invention, a mixed layer having silicon particles and silicon oxide particles are mixed is present in an interface between a silicon substrate and a silicon oxide film, a model for giving a dielectric function of the mixed layer by effective medium theory is set, and a dielectric function of the silicon oxide film computed based on reflectances is agreed with the model, whereby the interface of the silicon oxide film can be correctly evaluated.

The silicon oxide film evaluation apparatus according to the present invention comprises irradiating means for applying radiation of a plurality of incident angles to a silicon oxide film, measuring means for measuring reflected radiation of the radiation of the plural incident angles on the silicon oxide film, and computing means for computing reflectances for the radiation of the respective incident angles, based on the radiation of the plural incident angles and reflected radiation of different reflection angles, and based on reflectances for the respective incident angles, a dielectric constant of the silicon oxide film is computed, whereby film quality of the silicon oxide film formed on the silicon substrate can be evaluated in noon-contact and non-destructively.

BRIEF DESCRIPTION OF THE DRAWINGS

FIG. 23 is a view of the semiconductor fabrication apparatus according to Embodiment 5 of the present invention.

DETAILED DESCRIPTION OF THE INVENTION

EMBODIMENT 1

The silicon oxide film evaluation apparatus according to Embodiment 1 of the present invention will be explained with reference to FIGS. 1 to 3.

Silicon Oxide Film Evaluation Apparatus

Figure 1:
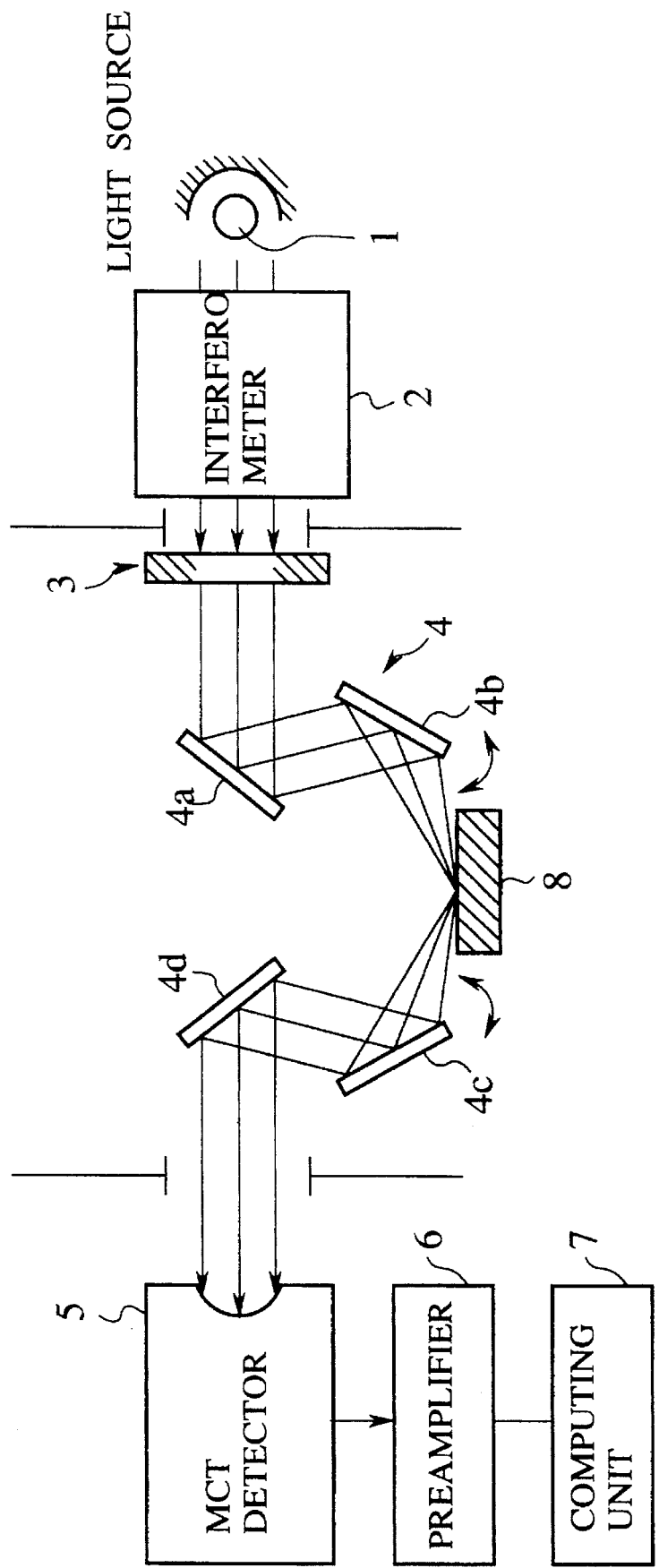
FIG. 1 is a view of the silicon oxide film evaluation apparatus according to Embodiment 1 of the present invention.

The silicon oxide film evaluation apparatus according to Embodiment 1 is shown in FIG. 1 (see Mitsuo Tasumi, "Foundation and Practice of FT-IR", p. 103). The evaluation apparatus of FIG. 1 is a surface reflection type infrared absorption spectrum measuring apparatus by FTIR (Fourier Transform Infrared Spectroscopy).

As a sample 8 to be evaluated, a silicon substrate with a silicon oxide film formed on is placed at the center of the apparatus. Infrared radiation from an irradiation system on the right side of the sample 8 are reflected on the surface of the sample 8, and the reflected rays are measured by a measuring system on the left side of the apparatus and analyzed.

The irradiation system on the right side of the sample 8 includes a light source 1 for infrared radiation. The infrared radiation from the light source 1 passes through the interferometer 2 and the polarizer 3 to be emitted in a bundle of parallel rays. Because of the polarizer 3, P wave infrared radiation whose electric field is parallel with an incident plane (plane of an optical path) can be emitted.

The emitted infrared radiation is reflected against a mirror 4a and condensed by a concave mirror 4b to be incident slantly on the surface of the sample 8. The concave mirrors 4b and 4c are turned to change an angle of incidence on the sample 8.

Reflected light on the sample 8 is made into a bundle of parallel rays by a concave mirror 4c and is reflected by a mirror 4d to be incident on an MCT (Mercury Cadmium Telluride) detector 5. The MCT detector 5 detects the reflected radiation from the sample 8. Detection signals from the MCT detector 5 are amplified by a preamplifier 6 and outputted to a computing unit 7. The computing unit 7 computes a reflectance of the surface of the sample 8, based on the detection signals from the preamplifier 6 and, as will be explained later, gives a dielectric function.

In this embodiment, the concave mirrors 4b and 4c are so turned that the radiation is incident on the surface of the sample 8 at a plurality of incident angles, and reflected radiation from the sample 8 is measured for the incident radiation of the respective plural incident angles. Based on the incident radiation of the plural incident angles and the reflected radiation of a plurality of angles, reflectances for different angles are computed, and based on the reflectances for different angles, a dielectric function of the silicon oxide film is given. Based on the given dielectric function, film quality of the silicon oxide film is evaluated.

According to the silicon oxide film evaluation method according to Embodiment 1, reflectances by the silicon oxide of the radiation incident at angles larger than a Brewster angle and those of the radiation incident at angles smaller than the Brewster angle are more changed than those by the silicon substrate so as to correctly give a dielectric function of a silicon oxide film.

Principle of the Silicon Oxide film Evaluation Method

The principle of the silicon oxide film evaluation method according to Embodiment 1 will be explained.

Generally spectra given by infrared spectroscopy depend on responses of a material, a silicon oxide film here, to electromagnetic waves, i.e., dielectric constants. Since the dielectric constants reflect a structure of the material on atomic and molecular levels, based on absorption and reflection peaks of infrared spectra the structure of the material can be evaluated. But actual measured spectra include, in addition to the peaks, information of the substrate, the optical system, and, if the material is a film, a thickness thereof.

For this reason, the conventional evaluation method must prepare control samples having similar thickness so as to analyze structural differences of silicon oxide films. That is, it is necessary that the same optical system is used, information of the silicon substrates are subtracted after measured, and the silicon oxide films have substantially the same thickness (within 5%).

Thus the conventional evaluation method using infrared spectroscopy can compare structures of silicon oxide films only between silicon oxide films of the same thickness.

The silicon oxide film evaluation method according to Embodiment 1 has solved this disadvantage of the conventional evaluation method and can compare silicon oxide films of different thicknesses in film quality.

Generally a dielectric constant of a silicon oxide film is represented by the complex number $$\epsilon = \epsilon' + i\epsilon''.$$

This is because electromagnetic fields, as of infrared radiation undergo phase shifts when entering a material, such as a silicon oxide film. The dielectric constant varies depending on wavelengths (wave numbers), and it is necessary that the dielectric function has to be represented by a function (dielectric function) of wave numbers.

Thus the dielectric function is represented by the complex numbers as a function of wave numbers. Accordingly the dielectric function has the two unknown numbers, the actual part and the imaginary part. The dielectric function cannot be given by measuring only reflectances of infrared radiation on a silicon oxide film.

The inventors of the present invention noted that reflected radiation of infrared radiation of two or more different incident angles are measured to obtain two or more reflectances of a silicon oxide film, whereby the dielectric function having the two unknown numbers, the actual part and the imaginary part, can be given.

In other words, they noted that based on two or more reflectances of infrared radiation of different incident angles on a silicon oxide film, the dielectric function having the two unknown numbers of the actual part and the imaginary part can be solved by a numerical computation, and applied this to the silicon oxide film evaluation method.

Using the thus-given dielectric function, an anticipated reflectance is given based on a thickness of a control silicon oxide film, and the anticipated reflectance is compared with an actually measured reflectance of the control silicon oxide film, whereby film quality of the silicon oxide film is evaluated.

The reflected rays on a silicon oxide film is P polarized light normal to the surface (parallel with the incident surface). For silicon oxide films, which are expected to have structures changed thickness-wise, it is preferable that P polarized light is used as incident light in place of transmitted light and S polarized light (normal with the incident surface).

A conventional method for giving a dielectric function uses Kramers-Kronig relations. Reflectances are measured for all wave number regions, whereby a dielectric function can be given by the following Kramers-Kronig relations.

$$r = |(r)| \exp i\theta$$

$$\theta(\upsilon) = \frac{\upsilon_g}{\pi} \left[ \int_0^\infty \left[ d\upsilon \frac{\{ln\ R(\upsilon)\}}{\{\upsilon^2 - \upsilon_g^2\}} \right] \right]$$

But the method using Kramers-Kronig relations cannot be used when reflected light by complex multiple reflection in the silicon substrate is present. This method cannot be used for objects to be evaluated, such as silicon oxide films formed on silicon substrates on which multiple reflection takes place.

In the silicon oxide film evaluation method according to Embodiment 1, a reflectance r for silicon oxide film of a single layer is expressed as follows.

$$r = \frac{(Y_1 - Y_2)\cos(N_2\delta) + i\{Y_2 - (Y_1Y_3)/Y_2\}\sin(N_2\delta)}{(Y_1 + Y_2)\cos(N_2\delta) - i\{Y_2 + (Y_1Y_3)/Y_2\}\sin(N_2\delta)}$$

where
$Y_j = (\cos\theta_j)/n_j$
$\delta = 2\pi\upsilon t$
$N_j = \sqrt{(n_j^2 - \sin^2\theta)}$
$n_j^2$: dielectric constant
$n_j$: refractive index
$\upsilon$: wave number
j: medium (1=air) (2=silicon oxide film) (3=silicon)

An incident electromagnetic field, a reflection electromagnetic field and a refraction electromagnetic field are classically solved, and the reflectance r is expressed by the following formulas known as Fresnel's formula.

$$Y_j = (\cos\theta_j)/n_j$$

$$r = (Y_1 - Y_2)/(Y_1 + Y_2)$$

In the case that a plurality of interfaces are present as in a film on the substrate, an intensity ratio of incident radiation to exit radiation is given by the following formula in consideration of energy flowing through the film.

$$r = \frac{(Y_1 - Y_2)\cos(N_2\delta) + i\{Y_2 - (Y_1Y_3)/Y_2\}\sin(N_2\delta)}{(Y_1 + Y_2)\cos(N_2\delta) - i\{Y_2 + (Y_1Y_3)/Y_2\}\sin(N_2\delta)}$$

where
$Y_j = (\cos\theta_j)/n_j$
$\delta = 2\pi\upsilon t$
$N_j = \sqrt{(n_j^2 - \sin^2\theta)}$
$n_j^2$: dielectric constant
$n_j$: refractive index
$\upsilon$: wave number
j: medium (1=air) (2=silicon oxide film) (3=silicon)

This formula is for an amplitude reflectance. Using a formula expressing an actual measured energy reflectance, an external reflectance on the outside surface and an internal reflectance are computed. Multi reflection in the silicon substrate on the assumption that multiple internal reflection in the silicon substrate does not interfere but simply adds, the following formula can be given in series.

$$R = R1 + (T_1T_2A^2R_0)/(1 - A^2R_0R_2)$$

where $R_0, R_1, R_2$: reflectances
A: absorption
$T_1, T_2$: transmittance

By this formula a detected reflectance R can be given.

In this formula, the term $A^2R_0$ represents a reflectance on the silicon substrate, and a reflectance on the bottom of the silicon substrate. This term gives a value taking into account various reflectances on a silicon substrate forming an actual semiconductor device doped with impurities, and scattering on the bottom of the silicon substrate, which is not abraded in a speculum.

This value is given by being agreed with an actual measured value. An absolute reflectance on a silicon substrate with silicon oxide film formed on is corrected by the use of a gold mirror. The gold mirror is used as a reference of reflectances it is assumed that the gold mirror has a reflectance of 1 over all the wavelength ranges. With a reflectance of the gold mirror 1 being 1, an absolute reflectance on a silicon substrate without silicon oxide film is given. Based on thus measured values, a value of $A^2R_0$ term is given.

Then, when a dielectric constant is give, spectra to be actually measured can be simulated.

Silicon Oxide Film Evaluation Method

Figure 2:
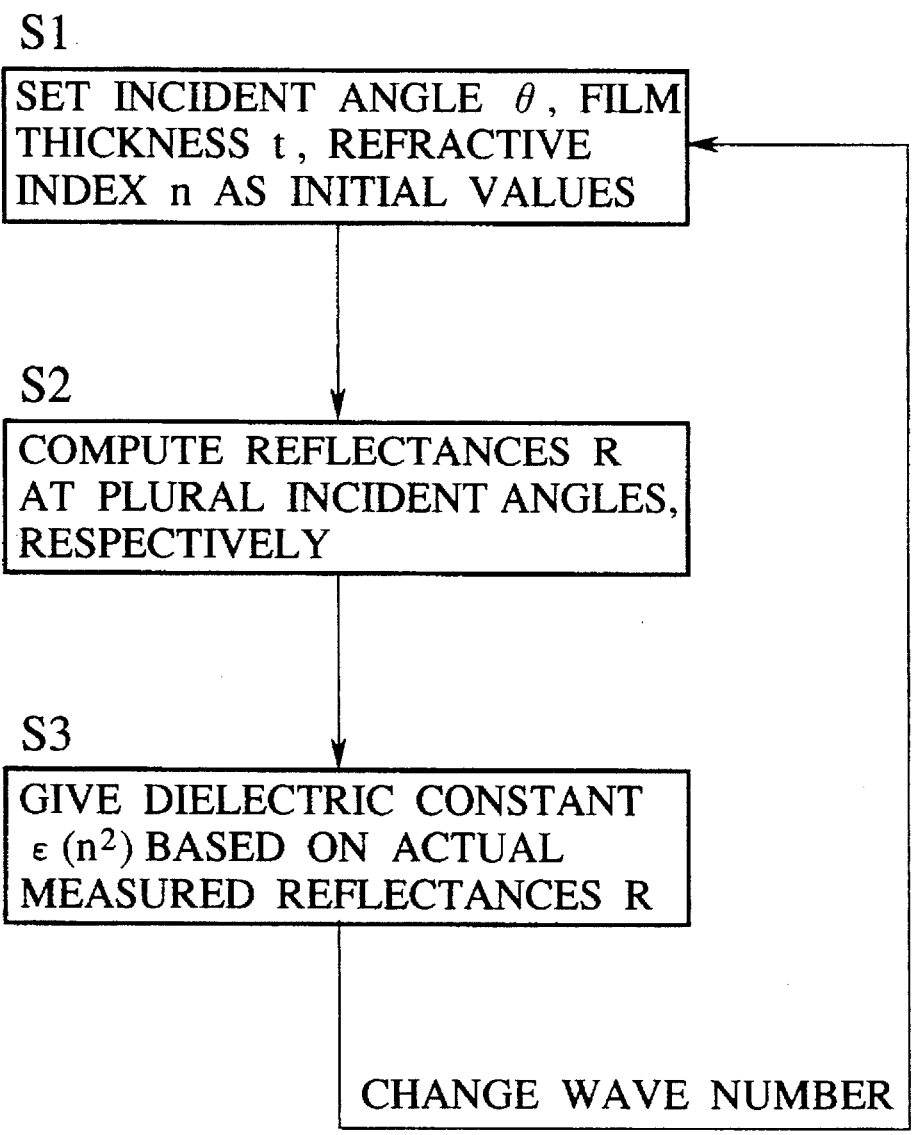
FIG. 2 is a flow chart of the steps of the silicon oxide film evaluation method according to Embodiment 1 of the present invention.
Figure 3:
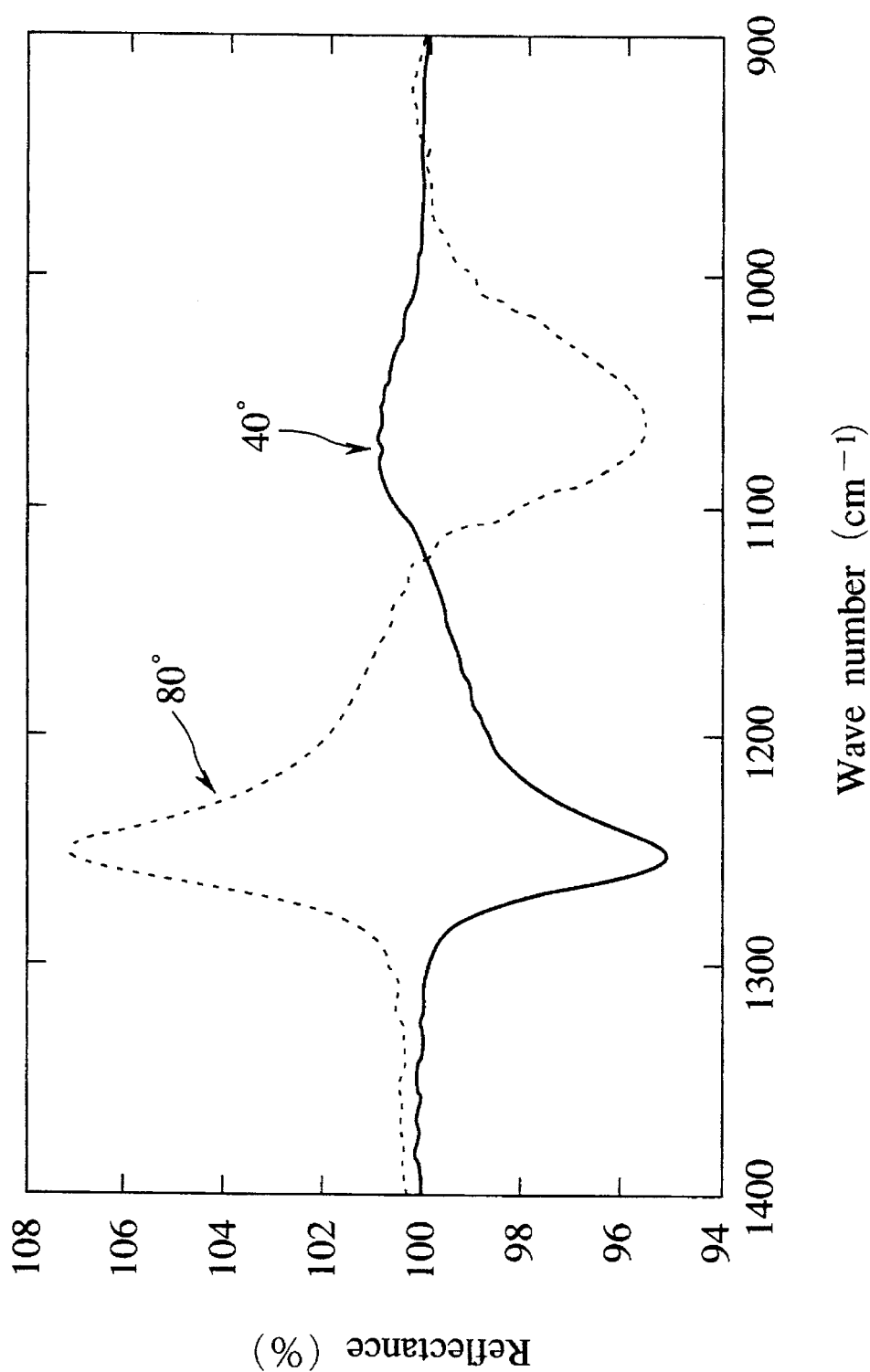
FIG. 3 is a graph of measured results by the silicon oxide film evaluation method according to Embodiment 1 of the present invention.

FIG. 2 shows a procedure for giving a dielectric constant based on reflectances of two or more incident angles.

First, incident angles θ, a film thickness t and refractive indexes n are set (step S1). Incident angles θ can be known in measuring conditions. A film thickness t is separately measured. Refractive indexes n are complex number within a range of dielectric constants $\epsilon(=n^2)$ of a silicon oxide film can have.

Using the above-described formula, reflectances R are given for the set plural refractive indexes n (step S2). Thus a graph of relationships between the refractive indexes n and computed values of the reflectances R.

Then, on the graph of relationships between the refractive indexes n and the computed values of the reflectances R refractive indexes n of the silicon oxide film are given reversely based on actual measured values of reflectances R (step S3). Based on the given refractive indexes, a dielectric constant $(=n^2)$ can be given.

The computation of dielectric constant $\epsilon(=n^2)$ by the above-described Steps S1 to S3 is conducted over a required wave number range, and a dielectric function can be given.

Based on dielectric functions, Embodiment 1 evaluates film quality of a silicon oxide film. The general method of the evaluation will be explained.

First, a silicon oxide film is formed on a silicon substrate under processing conditions which are strictly controlled so as to be references of evaluations. A dielectric function is given on the thus formed reference silicon oxide film by the above-described method.

Then, the same dielectric function is applied to a silicon substrate with a silicon oxide film to be evaluated formed on the assumption that the silicon film has the same film quality as the reference silicon oxide film, and spectra of dummy reflectances of the silicon oxide film to be evaluated are computed.

Then actual measured spectra of reflectances of the silicon oxide film to be evaluated, and the spectra of dummy reflectances are compared. As a result of the comparison, if there is a difference between the actual measured and the dummy spectra, the difference reflects differences in film structure between the silicon oxide film to be evaluated and the reference silicon oxide film. Film quality of the silicon oxide film to be evaluated can be evaluated with respect to the reference silicon oxide film.

Next, as an example of the silicon oxide film evaluation method, a procedure of the silicon oxide film evaluation method for evaluating a silicon oxide film having a different film thickness will be explained.

First, a 100 nm-thickness silicon oxide film as a reference silicon oxide film is formed on a silicon substrate by thermal oxidation. A dielectric function is given on the reference silicon oxide film by the above-described method. The reference silicon oxide film is 100 nm because a silicon oxide film of such thickness is considered to have little thickness-wise variations of the thickness in most areas.

Then an approximate film thickness of the silicon oxide film to be evaluated is separately measured. On the assumption that the silicon oxide film to be evaluated has the same film quality as the reference silicon oxide film and is different only in film thickness from the other, dummy spectra of reflectances of the silicon oxide film to be evaluated are computed.

Subsequently spectra of reflectances of the silicon oxide film to be evaluated are actually measured. Actual measured values and the dummy spectra of reflectances are compared. As a result of the comparison, if there is a difference between the actual measured spectrum and the dummy spectra, the difference reflects a difference in film structure between the silicon oxide film to be evaluated and the reference silicon oxide film, and the film quality of the silicon oxide film to be evaluated can be evaluated with respect to the reference silicon oxide film.

Next, as an example of the silicon oxide film evaluation method, a procedure of the silicon oxide film evaluation method for evaluating a silicon oxide film formed at a different oxidation temperature will be explained.

First, a silicon oxide film as a reference silicon oxide film is formed on a silicon substrate while temperatures are correctly measured. A dielectric function is given by the above-described method on the thus-formed reference silicon oxide film. Subsequently a dielectric function is given by the above-described method on the silicon oxide film formed at a different oxidation temperature and under the other conditions.

The dielectric function of the reference silicon oxide film and that of the silicon oxide film to be evaluated are compared. If there is a difference, the difference reflects differences in film quality. Film quality of the silicon oxide film to be evaluated can be evaluated with reference to the reference silicon oxide film.

Embodiment 1-1

An about 9 nm-thickness silicon oxide film formed on a silicon substrate by thermal oxidation is to be evaluated. Reflectances of incident radiation of two or more different incident angles (40°, 80°) are measured. FIG. 3 shows the measured results. Incident angles are 40° and 80° because angles around the Brewster angle of the silicon oxide film (about 74°) are selected so that large differences occur in reflectance among incident radiation of the two or more incident angles. A dielectric function is computed using the two measured values of the reflectances in FIG. 3.

The silicon oxide film is removed by hydrogen fluoride to prepare a silicon substrate substantially without anything formed on the surface. With a reflectance of this silicon substrate as a reference, a reflectance of an object to be evaluated is determined as a relative value.

A measured value of the reflectance of the silicon substrate without anything formed on the surface is determined with a reflectance of a gold mirror assumed to be 1. Based on a thus measured value a value of the term, $A^2R_0$ by the absorption by the silicon oxide substrate itself, and the reflection on the bottom of the silicon substrate is given. Since reflectances on the bottom and optical path lengths of transmitted radiation vary depending on incident angles, values of $A^2R_0$ are given for the respective incident angles.

Dielectric functions are set, and using the given values of $A^2R_0$, reflectances R are computed by the following formula.

$$r = \frac{(Y_1 - Y_2)\cos(N_2\delta) + i\{Y_2 - (Y_1 Y_3)/Y_2\}\sin(N_2\delta)}{(Y_1 + Y_2)\cos(N_2\delta) - i\{Y_2 + (Y_1 Y_3)/Y_2\}\sin(N_2\delta)}$$

where
$Y_j = (\cos\theta_j)/n_j$
$\delta = 2\pi vt$
$N_j = \sqrt{(n_j^2 - \sin^2\theta)}$
$n_j^2$: dielectric constant
$n_j$: refractive index
v: wave number
j: medium (1=air) (2=silicon oxide film) (3=silicon)

$$R = R1 + (T_1 T_2 A^2 R_0)/(1 - A^2 R_0 R_2)$$

where $R_0, R_1, R_2$: reflectances
A: absorption
$T_1, T_2$: transmittance

The computed reflectances R are compared with actual measured values, and values of dielectric constants approximate to the measured values are given over a required wave-number range. Based on a thus given dielectric function, computation is made with, e.g., a film thickness varied. Computed values are compared with the actual measured values to evaluate film quality of a silicon oxide film of a different film thickness.

The silicon oxide film evaluation method according to Embodiment 1-1 os effective to evaluate, in addition to silicon oxide films of different film thicknesses, silicon oxide films formed under different oxidation conditions, such as oxidation temperatures, treatments before their oxidation, oxidation atmospheres, loading temperatures into oxidation furnaces, treatments after their oxidation, etc.

Since changes of oxidation conditions for forming silicon oxide films vary film structures of the silicon oxide films, dielectric functions are given by the method according to Embodiment 1-1 to evaluate the film structures.

It is possible that interrelationships between the comparison results and electric characteristics of the fabricated semiconductor devices are given to optimize conditions of forming the silicon oxide films.

Embodiment 2

The silicon oxide film valuation method according to Embodiment 2 of the present invention will be explained with reference to FIGS. 4 to 13.

According to this embodiment, the interface of a silicon oxide film is evaluated by IR-RAS (Infrared Reflection Absorption Spectroscopy).

Principle of silicon oxide film evaluation method for evaluating an interface of a silicon oxide film The inventors of the present invention propose that to evaluate a structure of a silicon oxide film it is effective to use IR-RAS to measure signals of around 1250 cm$^{-1}$ wave number and around 1060 cm$^{-1}$ wave number of infrared absorption spectra.

But signals of around 1250 cm$^{-1}$ wave number and around 1060 cm$^{-1}$ wave number are indicative of information of a film structure of a silicon oxide film and do not determine characteristics of a semiconductor device, but are not indicative of a structure of the interface between the silicon substrate and the silicon oxide film.

Signals of around 1060 cm$^{-1}$ wave number are indicative of Transverse Optical phonon polarirons (TO phonons) of stretching vibrations of silicon-oxygen bonds (Si-O) by phonons, and signals of around 1250 cm$^{-1}$ wave number are indicative of Longitudinal Optical phonon polarirons (LO phonons) of stretching vibrations of silicon-oxygen bonds (Si-O) by phonons. Thus the signals are indicative of characteristics of a silicon oxide film bulk but are not indicative of a structure of the interface of a silicon substrate and the silicon oxide film.

Consequently it has not been known in which wave number range of infrared absorption spectra signals indicative of a structure of the interface between a silicon substrate and a silicon oxide film which actually much influences characteristics of semiconductor devices take place.

The inventors of the present invention made earnest studies as to which wave number range of reflectance or absorption spectra by IR-RAS and have found that signals of around 1100–1230 cm$^{-1}$ wave number of reflectance or absorption spectra of a silicon oxide film measured by IR-RAS should be noted.

Figure 4:
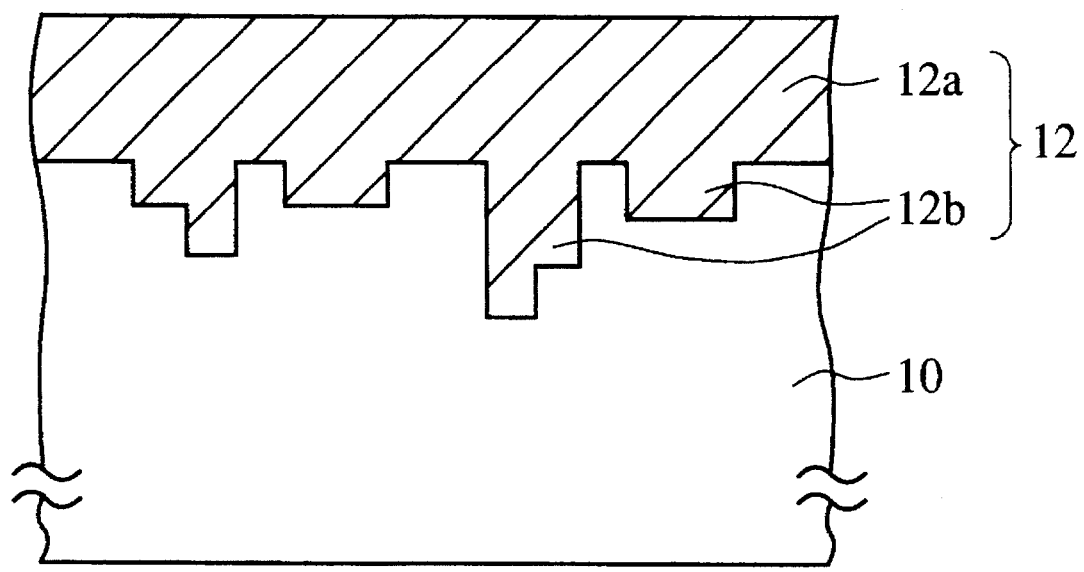
FIG. 4 is a schematic view of an interface of a silicon substrate and a silicon oxide film.

The interface of a silicon substrate and a silicon oxide film is not always flat, but, as schematically shown in FIG. 4, the silicon oxide film 12 has got in the silicon substrate 10 at some places. In this case, it may be considered that the silicon oxide film 12 includes a film portion 12a and pile portions 12b in the silicon substrate 10.

The film portion 12a of the silicon oxide film 12 can be evaluated by measuring signals of around 1250 cm–1 wave number and around 1060 cm–1 wave number. The pile portions, whose sides and bottoms are silicon bulk, are considered to be under environments similar to silicon oxide deposited in crystallizing silicon by heat treatment or other.

It was reported that signals of infrared absorption of silicon oxide solid-solved in silicon crystal appear in a 1100 cm$^{-1}$ to 1230 cm$^{-1}$ wave number range (S. M. Hu, J. Appl. Phys., vol. 51, p. 5945, (1980)). Accordingly it is considered that signals of infrared absorption of the pile portions 12a of the silicon oxide film 12 appear in a 1100–1230 cm$^{-1}$ wave number range.

Figure 5:
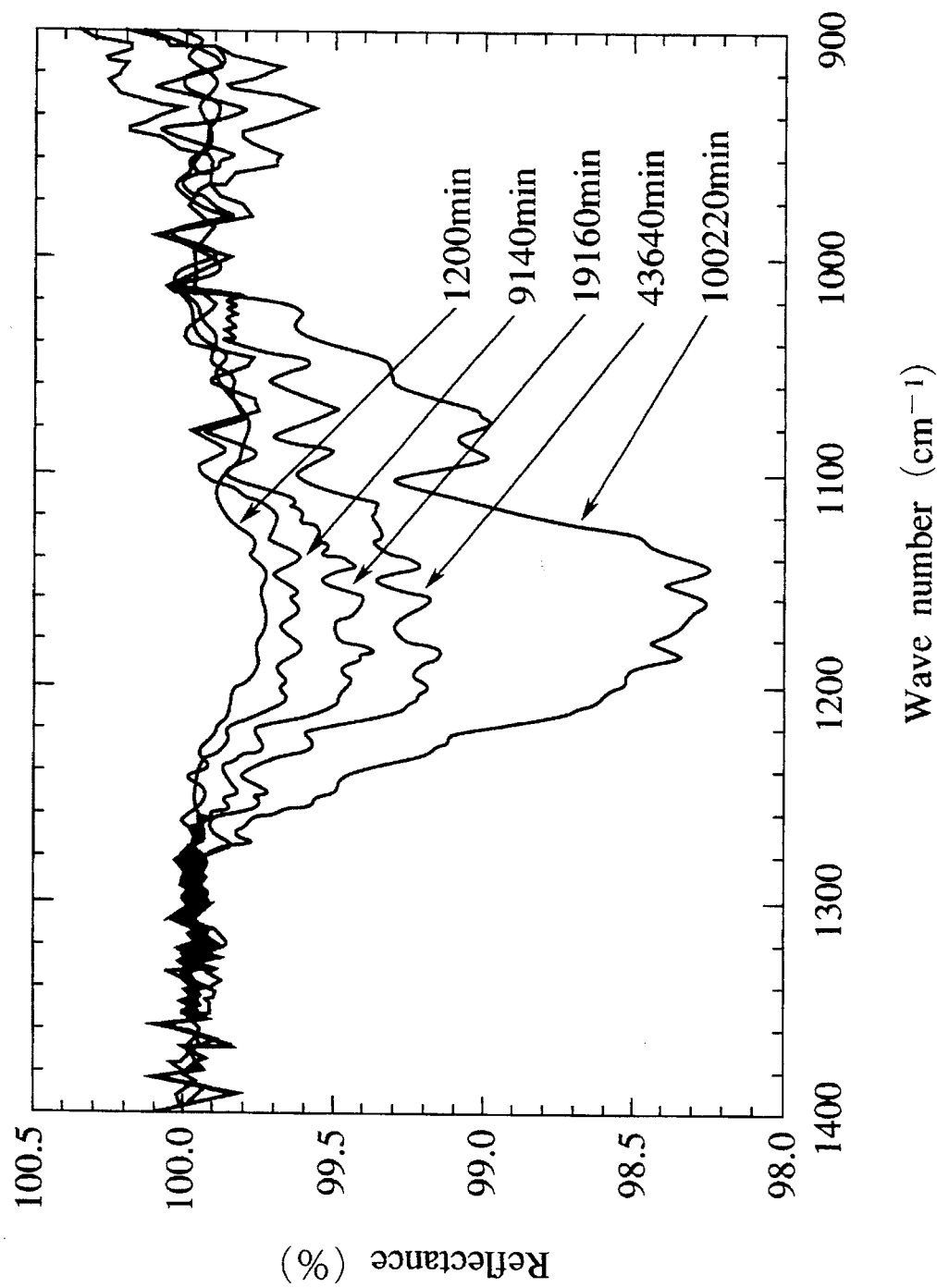
FIG. 5 is a graph of infrared absorption spectra of silicon substrates left in pure water.

FIG. 5 is a graph of infrared absorption spectra of silicon oxide formed by leaving a silicon substrate in pure water for a certain period of time. It is known that when a silicon substrate is left in pure water, natural oxide films are formed in island shapes on the surface of the silicon substrate. As the substrate is left longer, the oxidation advances, and natural oxide films in island shapes enlarge. As the substrate is left longer, as shown in FIG. 5, the absorption increases in a 1100–1230 cm$^{-1}$ wave number range and gradually changes.

The interface between a silicon substrate and a silicon oxide film has a structure, as in a natural oxide film, that the silicon oxide film gets in the silicon substrate. It is understood that to know a structure of the interface between the silicon substrate and the silicon oxide film, signals of a 1100–1230 cm$^{-1}$ wave number range are monitored.

Embodiment 2-1

Figure 6:
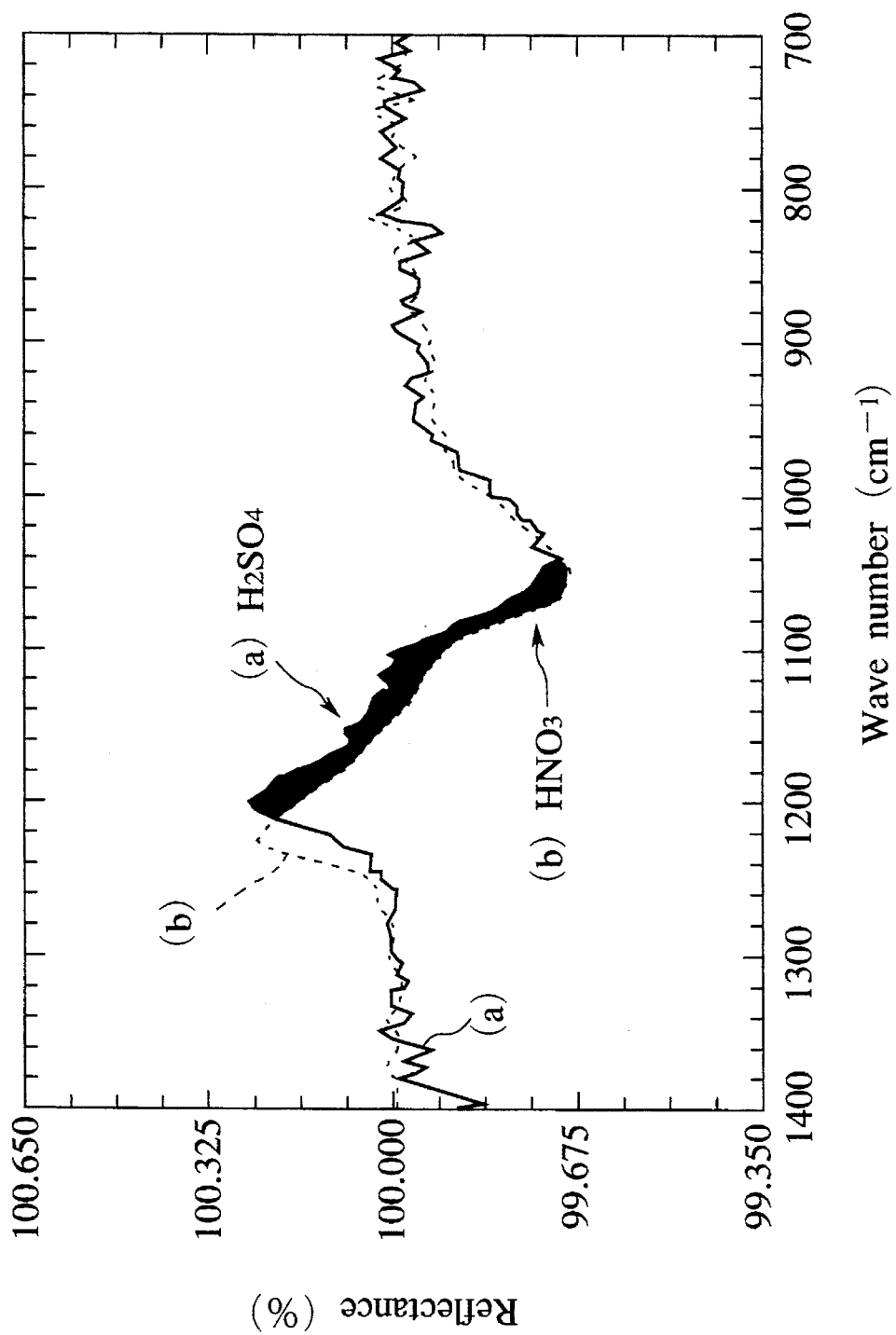
FIG. 6 is a graph of an infrared reflection spectrum (a) of a natural oxide film formed by immersing a silicon substrate at (100) plane in a mixed liquid of hydrogen fluoride and hydrogen peroxide, and an infrared reflection spectrum (b) of a natural oxide film formed by immersing a silicon substrate at (100) plane in a nitric acid solution.
Figure 7:
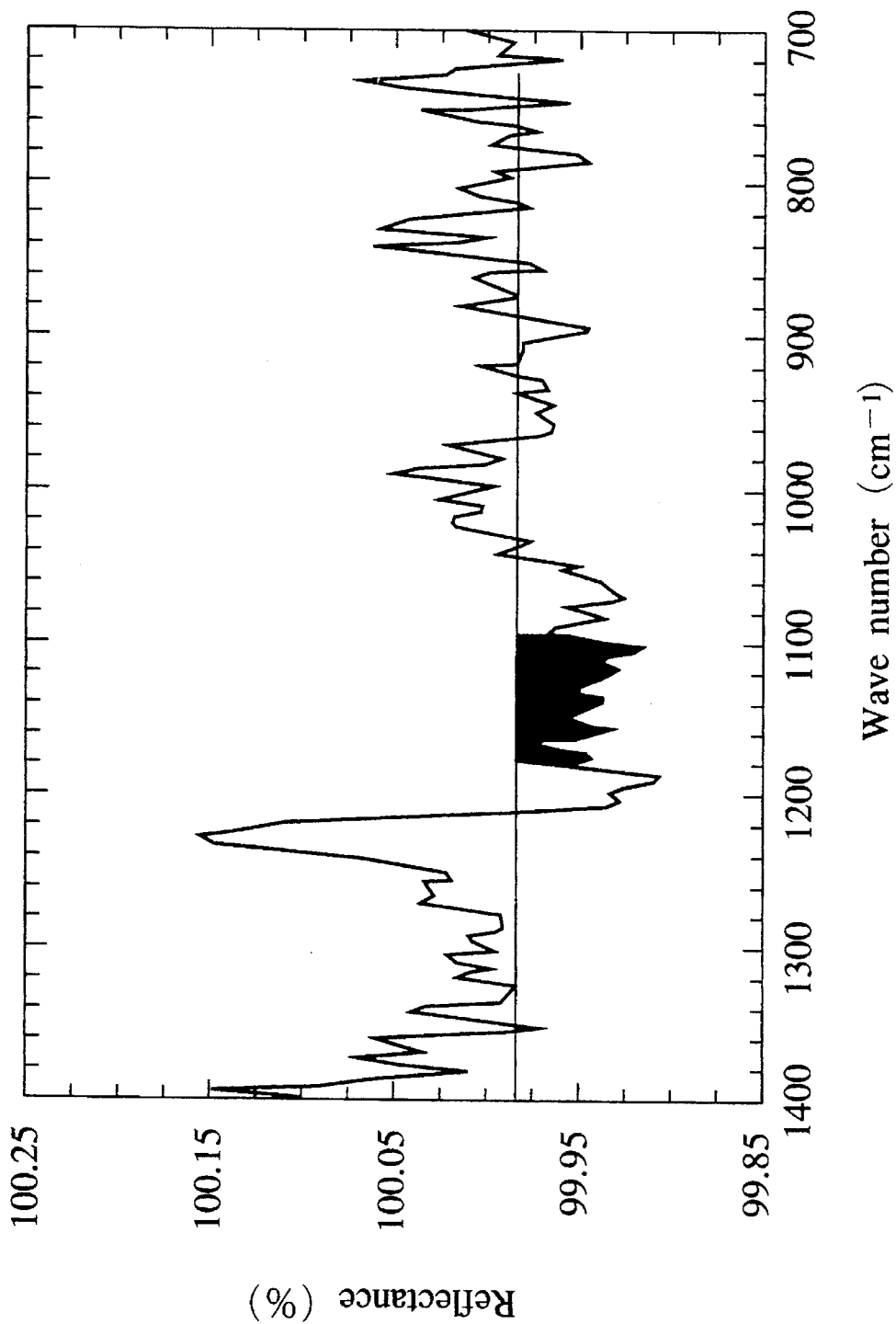
FIG. 7 is a graph of differences between the spectra (a) and (b) of FIG. 6.

FIG. 6 shows an infrared reflection spectrum (a) of a natural oxide film formed by immersing (100) plane of a silicon substrate in a mixed liquid of sulfuric acid and hydrogen peroxide, and an infrared reflection spectrum (b) of a natural oxide film formed by immersing (100) plane of a silicon substrate in a solution of nitric acid. FIG. 7 shows spectrum differences between the spectra (a) and (b).

The peak of absorption by the LO phonons around a 1230–1250 cm$^{-1}$ wave number, and that of absorption by the TO phonons around a 1060 cm$^{-1}$ wave number are different from each other in intensity and position, and FIG. 7 exhibits differences between the spectra. In FIG. 7 it is found that a spectrum difference is also present in a 1100–1200 cm$^{-1}$ wave number range.

Figure 8:
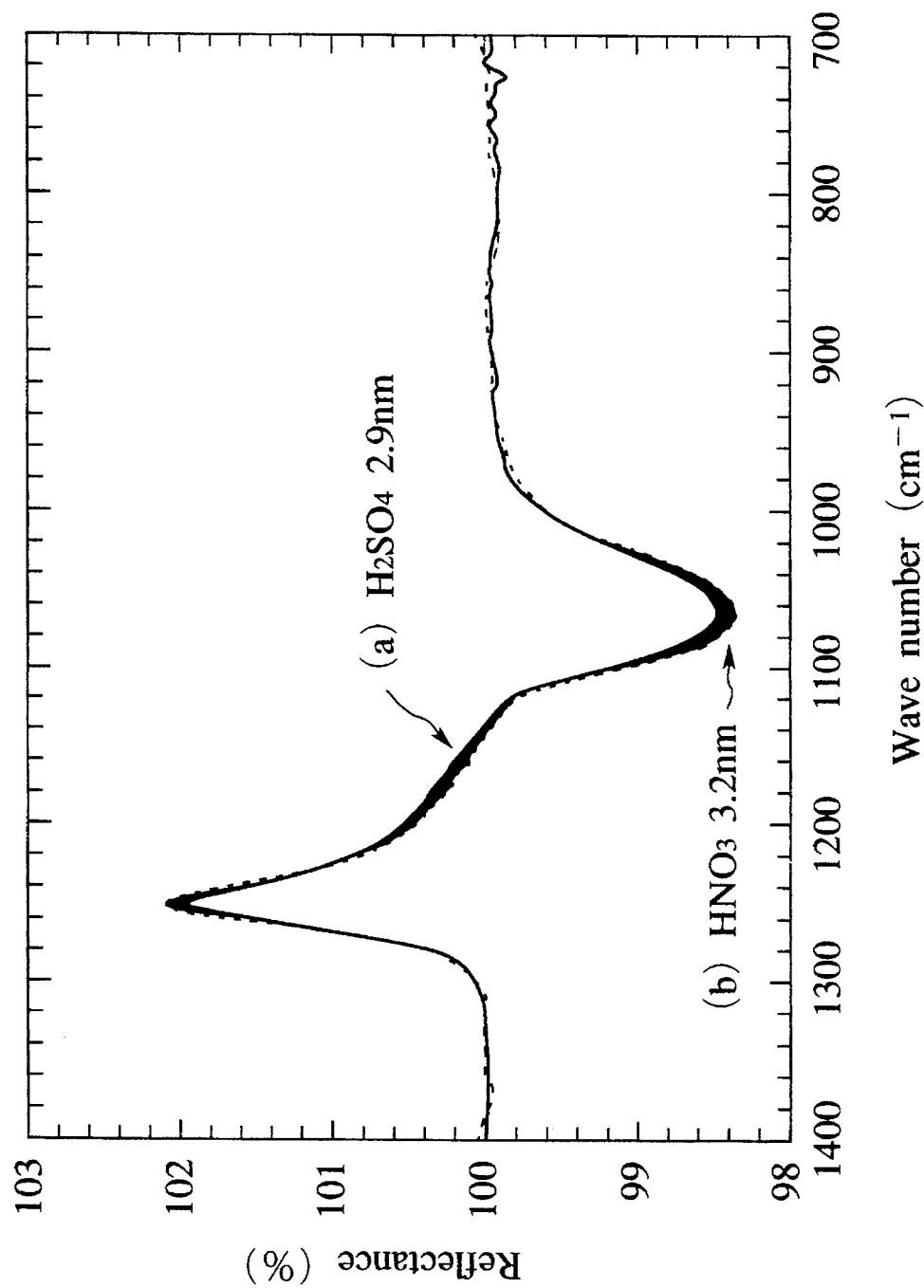
FIG. 8 is a graph of infrared reflection spectra of the silicon substrates of FIGS. 6 and 7 on which thermal oxide films are additionally formed, spectrum (a) being of the natural oxide film formed using the mixed liquid of sulfuric acid and hydrogen peroxide and then thermally oxidized, the spectrum (b) being of the natural oxide film formed using the nitric acid solution and thermally oxidized.
Figure 9:
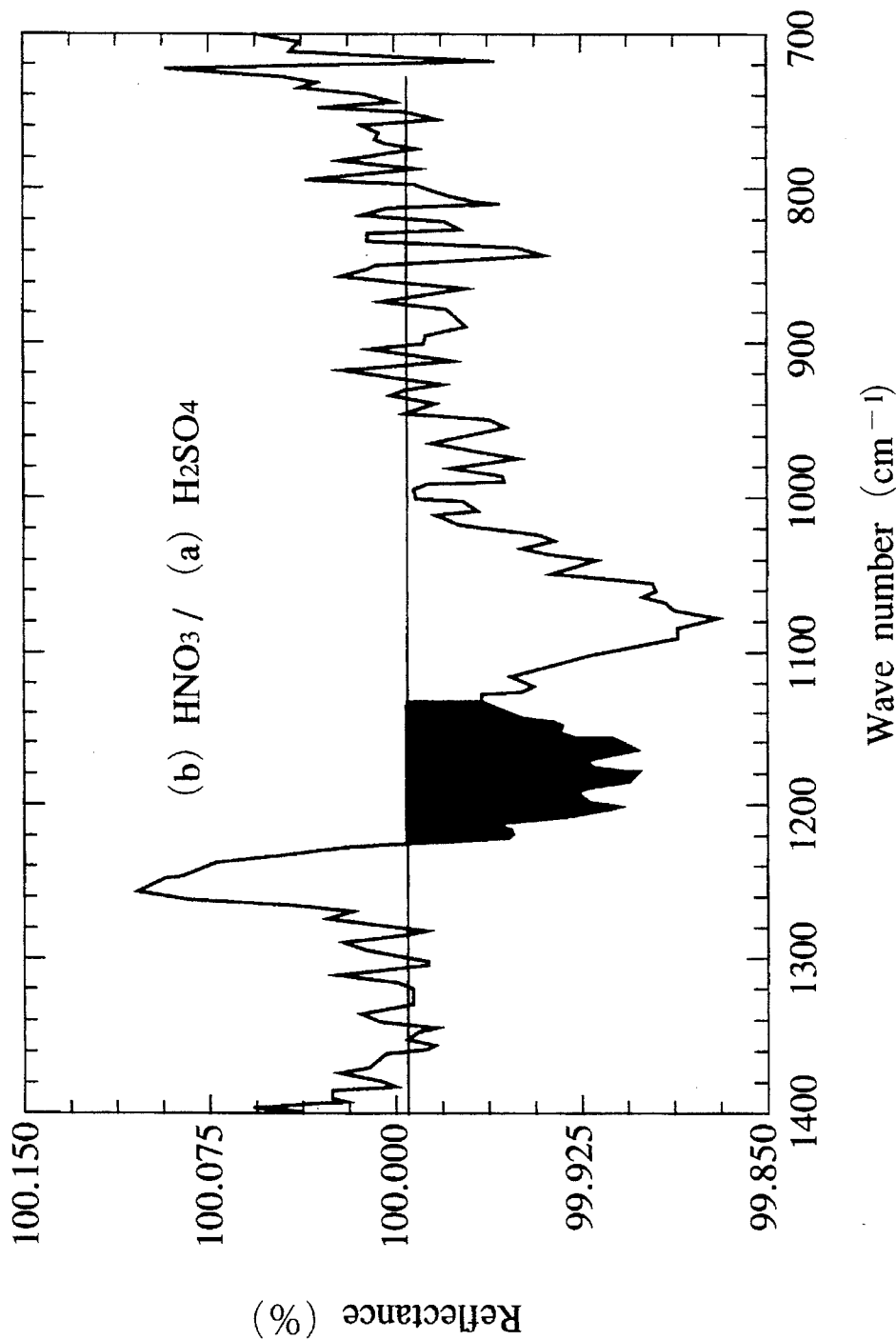
FIG. 9 is a graph of a spectrum of differences between the spectra (a) and (b) of FIG. 8.

FIG. 8 shows infrared reflection spectra of the silicon substrates of FIGS. 6 and 7 which were heated up to 800° C. in an oxygen atmosphere of 1 atmospheric pressure, and thermal oxide films of about 3 nm were formed thereon. The spectrum (a) is of the thermal oxide film (film thickness: 2.9 nm) formed after the natural oxide film was formed by the use of the mixed liquid of sulfuric acid and hydrogen peroxide, and the spectrum (b) is of the thermal oxide film (film thickness: 3.2 nm) formed after the natural oxide film was formed by the use of the nitric acid solution. FIG. 9 shows a spectrum of differences of the spectra (a) and (b).

As shown in FIG. 8, the peaks of absorption by the LO phonons and the TO phonons are made substantially equal to each other by the thermal oxidation. Only a small difference due to the film thickness difference is found between the two spectra. It is found that the film thickness of the substrate treated with the nitric acid is a little larger.

The thermal oxide films were actually measured by ellipsometry. A film thickness of the natural oxide film (spectrum (a)) formed by the use of the mixed liquid of sulfuric acid and hydrogen peroxide was 2.9 nm, and that of the natural oxide film (spectrum (b)) formed by the use of the nitric acid solution was 3.2 nm. The latter is a little thicker than the former.

The spectrum (a) has a higher intensity in a 1100–1200 cm$^{-1}$ wave number range, which is agrees with the tendency exhibited in FIGS. 6 and 7. That is, the influence of the pretreatment is exhibited still after the thermal oxidation in a 1100–1200 cm$^{-1}$ wave number range. Based on infrared reflection spectra in this wave number range, composition differences of thermal oxide films can be found.

Embodiment 2-2

Figure 10:
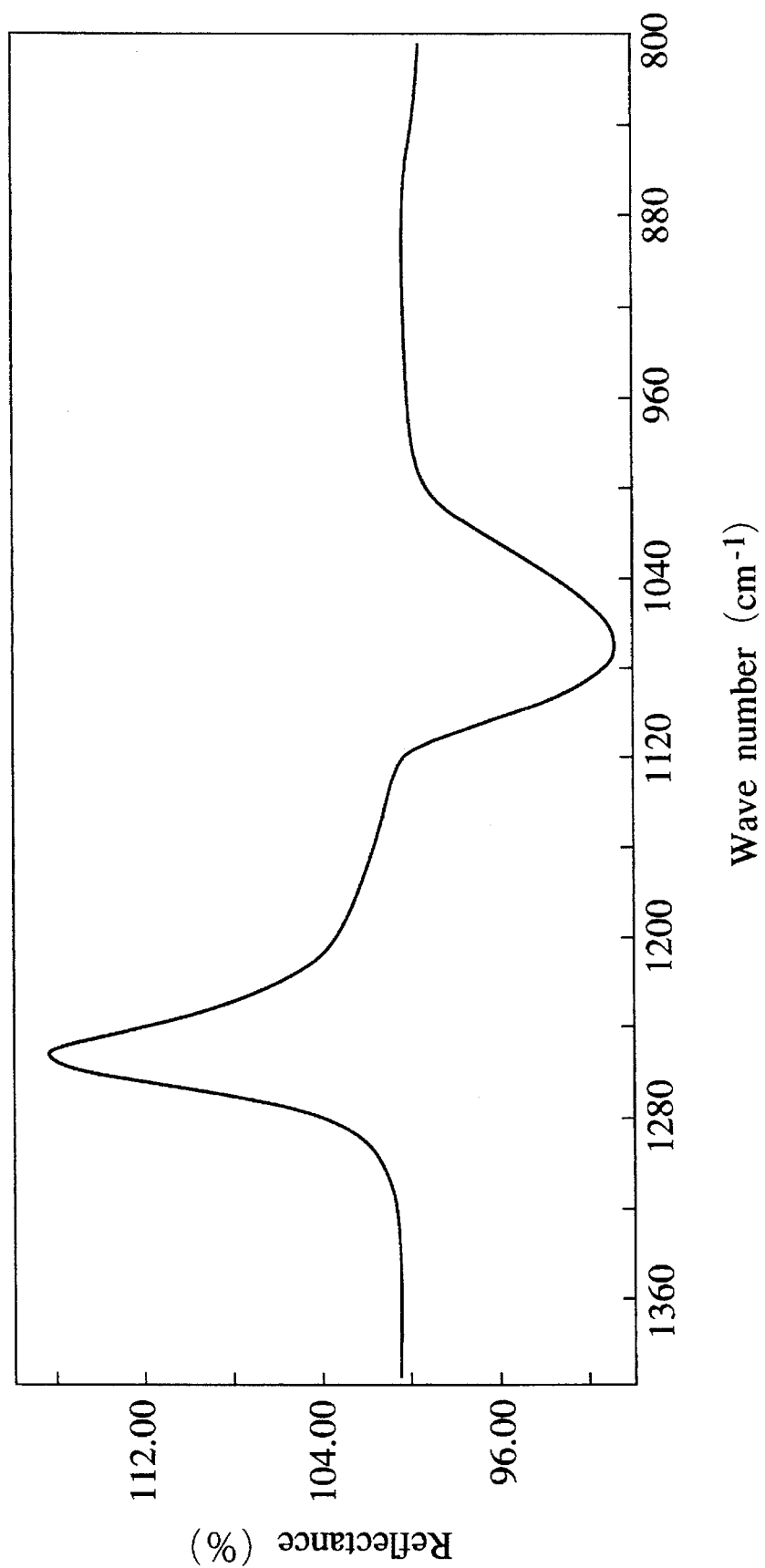
FIG. 10 is a graph of an infrared reflection spectrum of a silicon substrate thermally oxidized at about 950° C. and then unloaded from a furnace at about 900° C.
Figure 11:
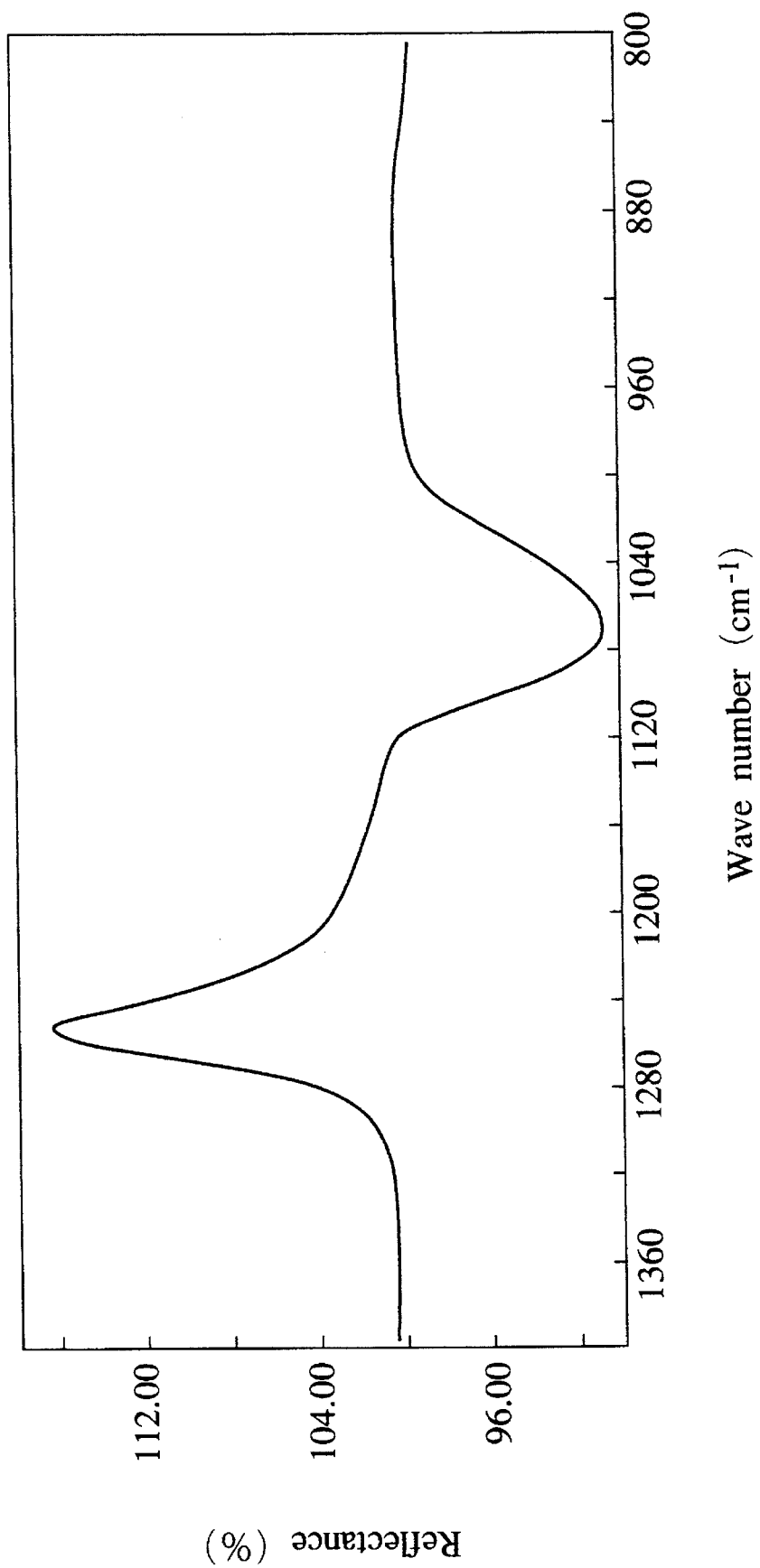
FIG. 11 is a graph of an IR-RAS spectrum of a silicon substrate thermally oxidized at about 950° C., and cooled down to the room temperature in a furnace and unloaded therefrom.
Figure 12:
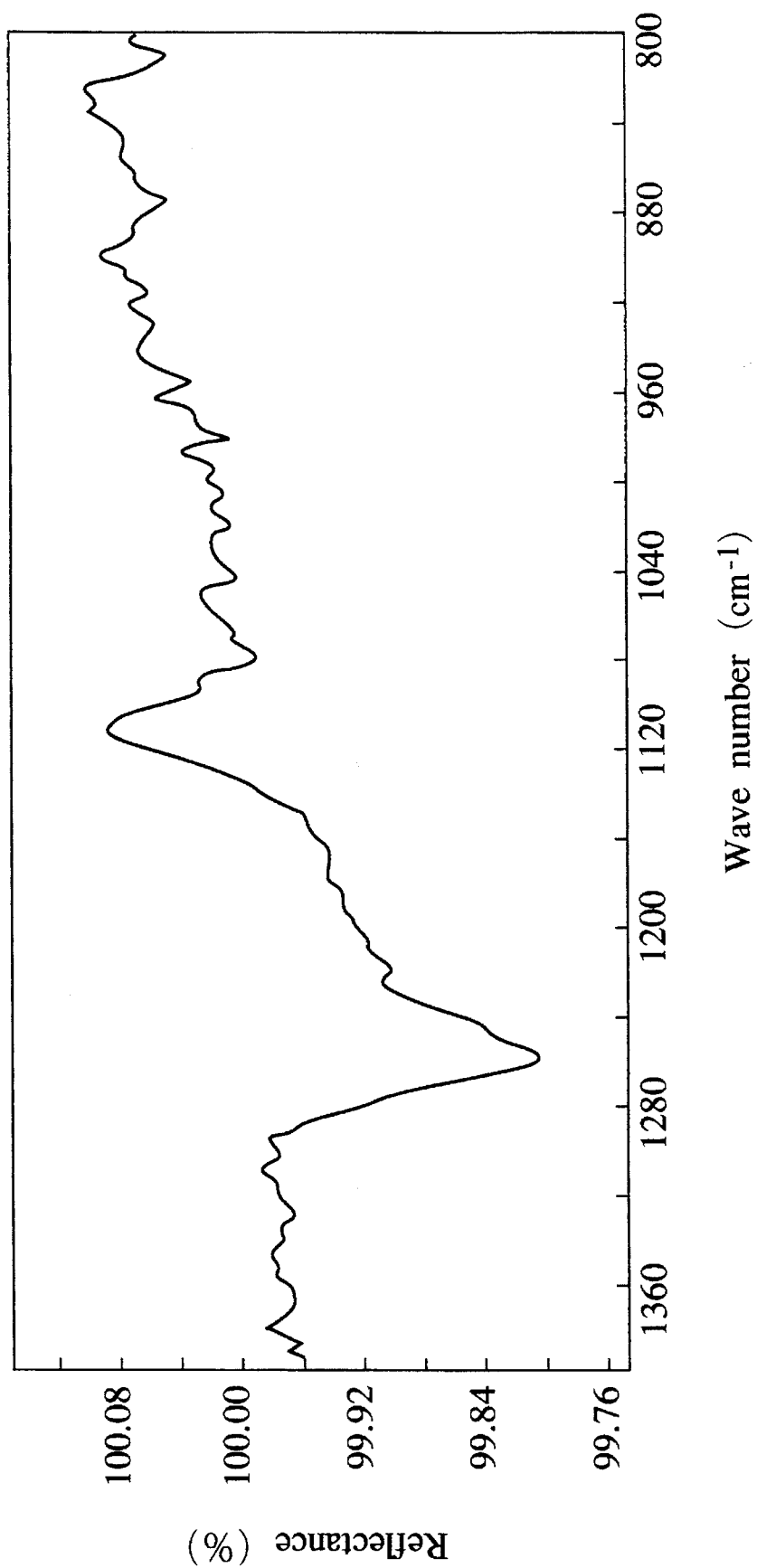
FIG. 12 is a graph of differences of the spectrum of FIG. 10 and the spectrum of FIG. 11.

FIG. 10 shows an infrared reflection spectrum of a silicon substrate which was thermally oxidized at about 950° C. and was unloaded from the furnace at about 900° C. FIG. 11 shows an infrared reflection spectrum of a silicon substrate which was cooled down to the room temperature in the furnace. FIG. 12 shows a spectrum of differences between the spectra of FIGS. 10 and 11.

As shown in FIG. 12, in Embodiment 2-2 as well, absorption peaks by LO phonons and TO phonons appear corresponding to film thicknesses.

What should be noted is that a peak appears around a 1114 cm$^{-1}$ wave number, as does not in FIGS. 10 and 11. It is known that charges and states in a silicon oxide film varies depending on unloading temperature differences. The peak in a 1114 cm$^{-1}$ wave number range corresponds to a difference of charges and states in a silicon oxide film. It is known that charges and states in a silicon oxide film depends on interface roughness Furthermore, the difference between the silicon substrates of FIGS. 10 and 11 is due to the difference of the final oxidation atmosphere, and both silicon substrates are considered to have interface structures between the silicon substrates and the silicon oxide films from each other. It is considered that the peak around a 1114 cm$^{-1}$ wave number is indicative of differences in structures of the interfaces between the silicon substrates and the silicon oxide films.

EMBODIMENT 2-3

Figure 13:
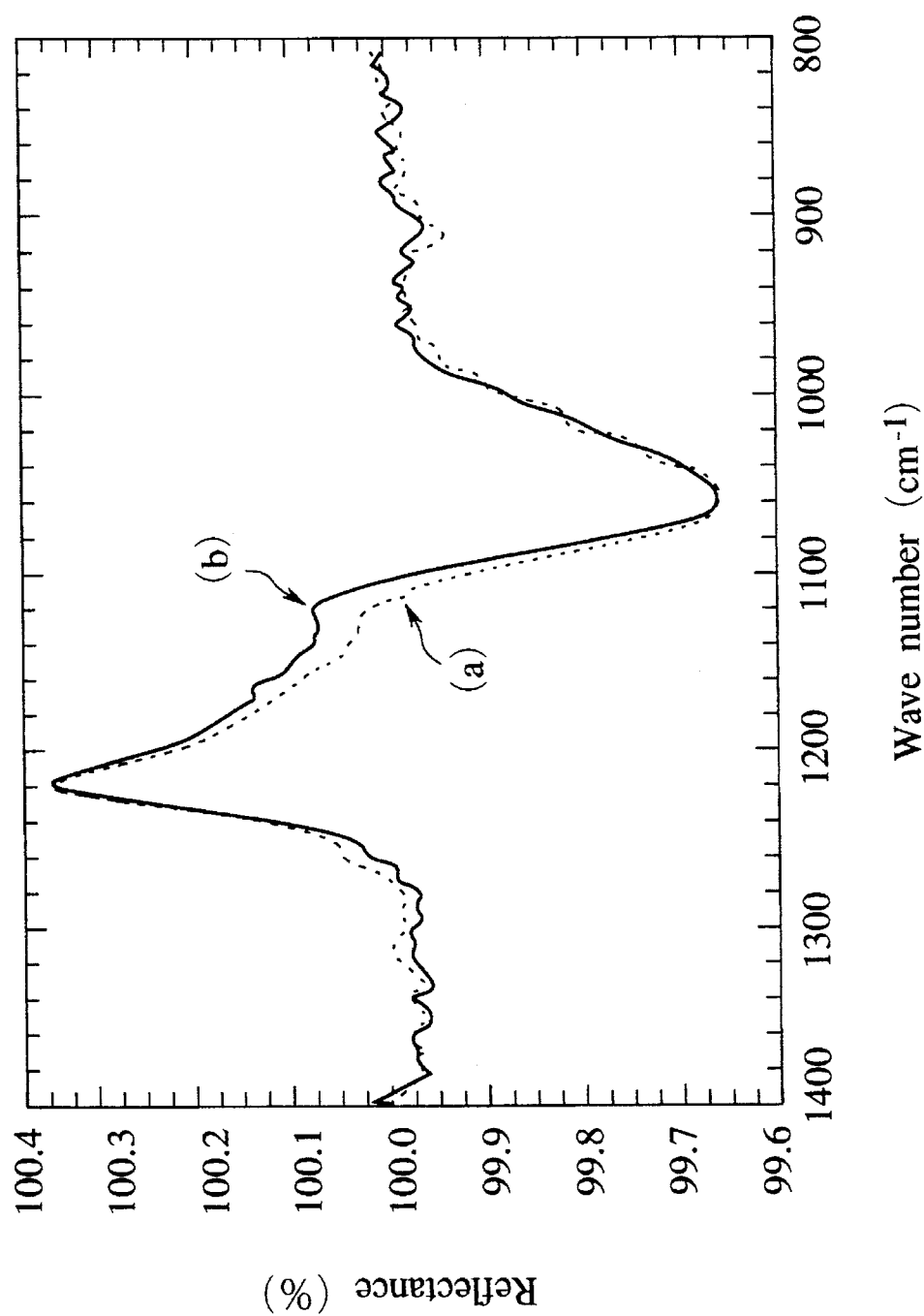
FIG. 13 is a graph of infrared reflection spectra of films treated respectively by different pretreatments before thermal oxidation, the spectrum (a) being of a silicon substrate having (100) plane pretreated with 5% hydrogen fluoride, the spectrum (b) being of a silicon substrate having (100) plane pretreated with a 7:1 mixed solution of hydrogen fluoride and ammonium fluoride.

FIG. 13 shows infrared reflection spectra of films treated by different pretreatments before thermal oxidation.

The spectrum (a) is of a silicon oxide film formed on a silicon substrate by pretreating the silicon substrate at (100) plane with 5% hydrogen fluoride for 1 minute, immersing the silicon substrate for 20 minutes in a 1:1 mixed solution of hydrogen peroxide and water, and heat treating the silicon substrate at 100° C. A thickness of the silicon oxide film measured by ellipsometry was 1.54 nm.

A spectrum (b) is of a silicon oxide film formed on a silicon substrate by pretreating the silicon substrate at (100) plane with a 7:1 mixed solution (BHF: Buffered Hydrogen Fluoride) of fluoric acid and ammonium fluoride for 5 minutes, immersing the silicon substrate for 20 minutes in a 1:1 mixed solution of hydrogen peroxide and water, and heat treating the silicon substrate at 100° C. A film thickness of the silicon oxide film measured by ellipsometry was 2.18 nm.

As shown in FIG. 13, both silicon oxide films are the same in the absorption peak by LO phonons around a 1230–1250 cm$^{-1}$ wave number and the absorption peak by TO phonons around a 1060 cm$^{-1}$ wave number. Both silicon oxide films have substantially the same film quality.

But as shown in FIG. 13, the spectrum (a) is more intense in a 1100–1200 cm$^{-1}$ wave number range than the spectrum (b). Accordingly the influence of the pretreatment is exhibited still after the thermal oxidation in a 1100–1200 cm$^{-1}$ wave number range. FIG. 13 shows that the interface associated with the spectrum (a) is rough in comparison with that associated with the spectrum (b).

EMBODIMENT 3

Figure 14:
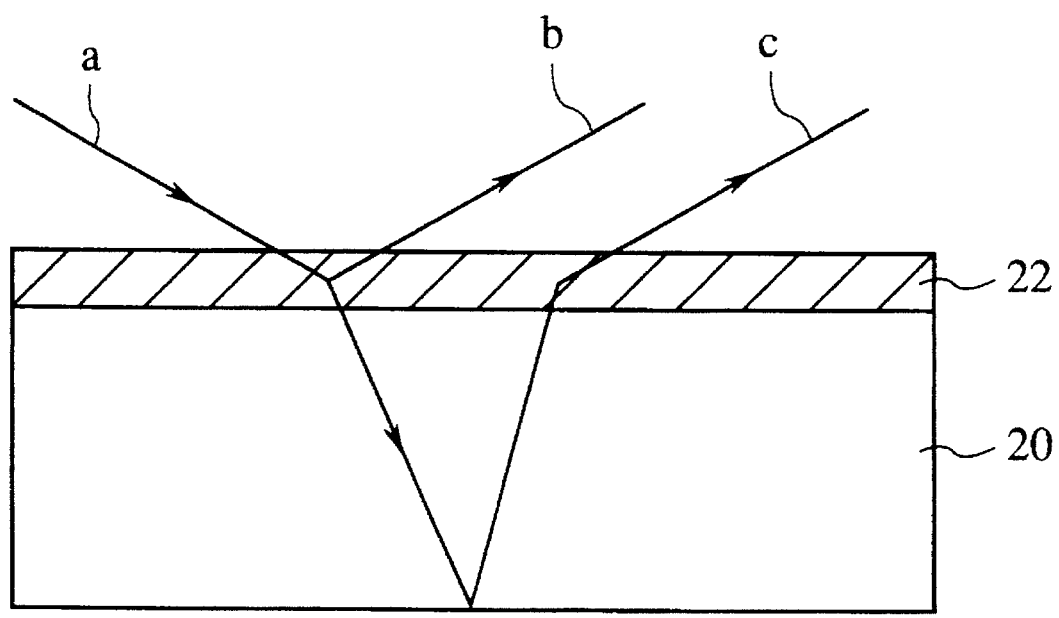
FIG. 14 is a view of optical paths of incident radiation, refracted radiation and reflected radiation in a silicon substrate with a silicon oxide film formed on in IR-RAS measurement.

The silicon oxide film evaluation method according to Embodiment 3 will be explained with reference to FIGS. 14 to 16.

In the above-described Embodiments 1 and 2, reflected radiation on the silicon oxide film on a silicon substrate is measured to evaluate the silicon oxide film. But as shown in FIG. 14, reflected radiation b alone of incident radiation on a silicon oxide film 22 is preferably measured, but unpreferably radiation c which has been reflected on the bottom of the silicon substrate 20 and transmitted through the silicon oxide film 22 is concurrently measured. Consequently the structural analysis of the silicon oxide film 22 on the silicon substrate, and observation of the vicinity of the interface between the silicon substrate 20 and the silicon oxide film 22 are incorrect, and the analysis and evaluation take time and labor. These are problems.

Embodiment 3 has successfully solved these problems and makes it possible to measure reflected radiation b reflected on a silicon oxide film.

Principle of Embodiment 3

Figure 15:
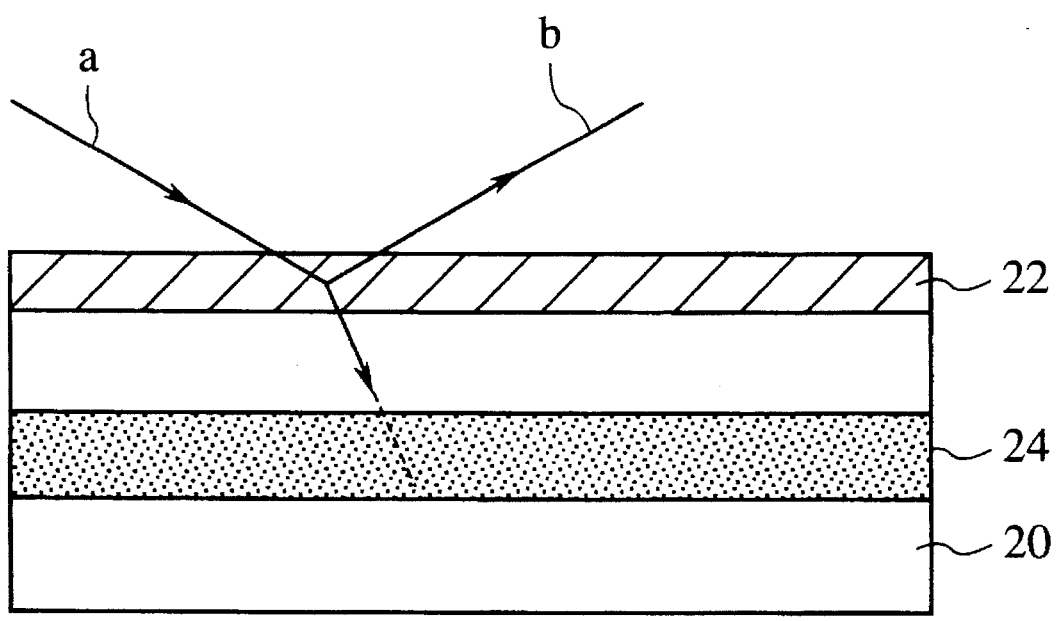
FIG. 15 is a view of the principle of the silicon oxide film evaluation method according to Embodiment 3 of the present invention.

The principle of this embodiment is shown in FIG. 15.

On the principle of FIG. 15, an infrared radiation absorbing region 24 for absorbing infrared radiation is provided in a silicon substrate 20 so that radiated components from the interface which is not a side of the silicon substrate to be measured can be neglected.

The infrared absorbing region 24 for absorbing infrared radiation may be formed in the entire of the silicon substrate 20, or an evaluation region is set in the silicon substrate 20 to provide the infrared absorbing region 20 in the evaluation region.

The infrared absorbing region 24 may be provided in a region below a semiconductor device formed on the silicon substrate 20. Gate oxide film to be used in the semiconductor device can be directly evaluated, which is effective in comparing with electric characteristics of the resultant semiconductor device.

Even with high absorbance, when the silicon substrate 20 is thin, all refracted radiation cannot be absorbed to adversely exit at the surface of the substrate. Then it is preferable that the silicon substrate 20 is made thick to allow the optical path to be longer so that transmitted components are absorbed during their transmission through the silicon substrate.

EMBODIMENT 3-1

A case that a 0.5 mm-thickness silicon substrate is doped with $1 \times 10^{15}$ atoms/cm$^3$ of boron will be discussed. An absolute reflectance is 8–10% when infrared radiation of a 80° incident angle.

On the other hand, a theoretical reflectance on the surface of silicon substrate is given by the following Fresnel's formula.

$$R = \frac{|\cos(\theta) - \sqrt{(\epsilon_{Si} - \sin(\theta)^2)} / \epsilon_{Si}|^2}{|\cos(\theta) + \sqrt{(\epsilon_{Si} - \sin(\theta)^2)} / \epsilon_{Si}|^2}$$

With a dielectric constant of silicon set at 11.7, a theoretical reflectance on the surface of the silicon substrate is 5.5%. It is found that the reflected radiation from the silicon substrate doped with the above-described concentration of boron considerably contains multiple internal reflection components in the silicon substrate.

An internal absorbed components for the case that a thickness of a silicon substrate is rated at 1 cm has an absorbance of 0.1–0.3 if given by the following Lambert's law.

$$I_{st} = I_o \times 10^{-ad}$$

This is insufficient to absorb the refracted radiation. The absorbance is 2 or more (absorption of above 99%) is sufficient to absorb within the substrate substantially all refracted radiation into the silicon substrate, and accordingly it is preferable that the silicon substrate has a thickness of above 10 mm.

The absorption of infrared radiation in a silicon substrate is considered to be conducted in three modes: by lattice vibration of the silicon; by free carriers; and by interstitial oxygens in a 1100 cm$^{-1}$ wave number. The absorption by lattice vibration of silicon is weak, and the absorption by interstitial oxygens is changed by heat treatments. It is considered effective to use the absorption by free carriers. To this end, a concentration of free carriers in a region-to-be-measured of a silicon substrate is increased so as to attenuate transmitted components in the silicon substrate.

Figure 16:
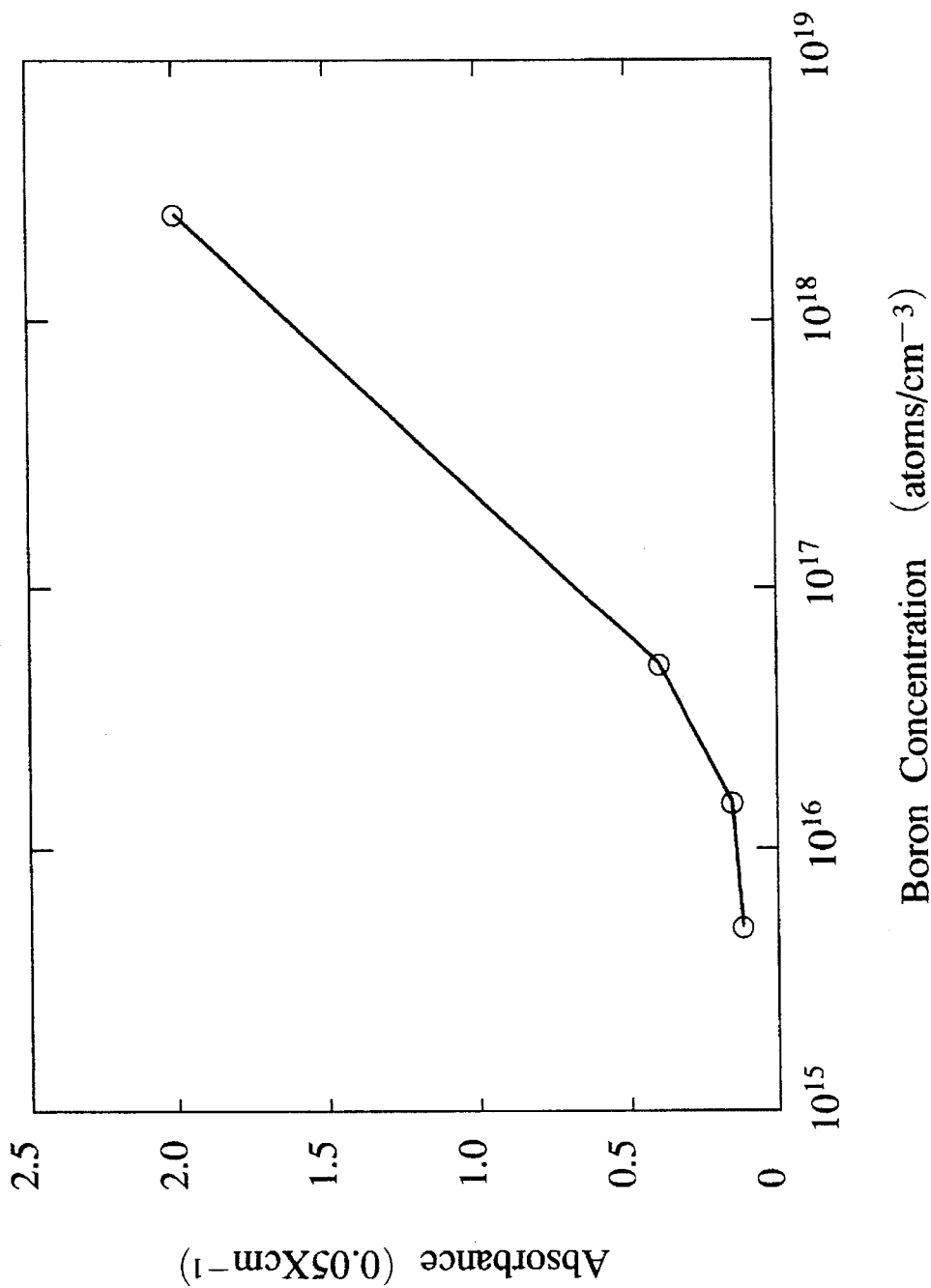
FIG. 16 is a graph of relationships between concentrations of boron added to a silicon substrate, and absorbances.

FIG. 16 shows a graph of the relationships between concentrations of boron added to a 5 mm-thickness silicon substrate, and absorbances. As apparent in FIG. 16, in a 5 mm-thickness silicon substrate, a free carrier concentration (boron concentration) for an absorbance of above 2 is above $1 \times 10^{18}$/cm$^3$. In a 1 cm-thickness silicon substrate, a free carrier concentration (boron concentration) is above $1 \times 10^{16}$/cm$^3$.

There is a risk that the addition of an impurity of such high concentration to a silicon substrate will change the mechanism of the silicon substrate with a result that characteristics of the semiconductor device will be affected.

For this reason, to form the infrared absorbing region it is preferable to contrive a dopant adding method.

For example, a impurity is added to a silicon substrate by ion implantation through the bottom thereof. The surface of the silicon substrate is kept from degradation by the ion implantation. Otherwise, a protecting film is formed on the surface of a silicon substrate, and an impurity is added through the bottom by thermal diffusion.

In forming the infrared absorbing region in a silicon substrate by ion implantation or others, it is preferable that a profile of an impurity concentration is not sharp. There is a risk that the infrared absorbing region with a very sharp profile of an impurity concentration will much reflect infrared radiation.

In the above described Embodiment 3, boron is added to a silicon substrate to establish a high concentration of holes as free carriers, but arsenic is added to increase a concentration of electrons as free carriers.

EMBODIMENT 4

The silicon oxide film evaluation method according to Embodiment 4 of the present invention will be explained with reference to FIGS. 17 to 22.

According to Embodiment 4, a new model of interface roughness of a silicon oxide film is set by IR-RAS, and a dielectric function is set so as to agree with the model, whereby the interface roughness is quantized.

A reflectance of a silicon oxide film is computed by the following procedure (Born, "Principles of Optics I, II, III").

It is assumed that a plurality of layers 320, 321, ..., 32m are formed one on another on a silicon substrate 30. A reflectance R is given by the following formula using characteristic matrix.

$$\begin{bmatrix} B \\ C \end{bmatrix} = \prod_{j=1}^{m} \begin{bmatrix} \cos(\delta_j) & -i(1/\eta_j)\sin(\delta_j) \\ -i(\eta_j)\sin(\delta_j) & \cos(\delta_j) \end{bmatrix} \begin{bmatrix} 1 \\ \eta_S \end{bmatrix}$$

where
$\delta_j = 2\pi v d_j N_j$
$N_j = \sqrt{\epsilon_j - \epsilon_0 \sin^2(\theta)}$
$\eta_j = N_j/\epsilon_j$
$\eta_0 = \cos(\theta)/\sqrt{\epsilon_1}$ $$R = \frac{|\eta_0 B - C|^2}{|\eta_0 B + C|^2}$$

$$T = \frac{4\eta_0 \eta_S}{|\eta_0 B + C|^2}$$

The unknown numbers in the above formula are an incident angle $\theta$, an incident radiation wave number $v$, dielectric functions $\epsilon$ in the respective layers 32, 321, ..., 32m, and thicknesses d0, d1, ..., dm of the respective layers.

Principle of Embodiment 4

Figure 18:
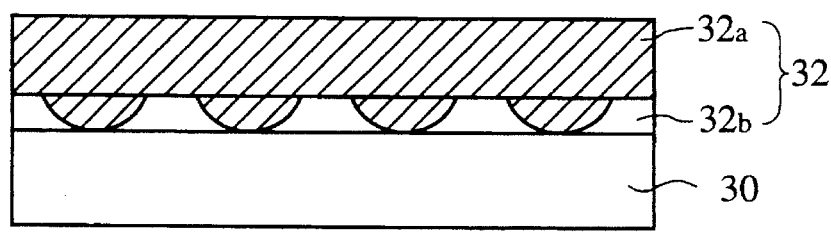
FIG. 18 is a view explaining a model of a silicon oxide film involved in Embodiment 4 of the present invention.

In this embodiment, as shown in FIG. 18, a model in which when a silicon oxide film 32 is formed on a silicon substrate 30, the silicon oxide film 32 comprises a layer 32a of silicon oxide, and a mixed layer 32b of silicon particles and silicon oxide particles on the interface is set. A dielectric function of the mixed layer 32b is given by effective medium theory.

Responses, such as reflection, to an incident electric field in a system in which sufficiently small silicon oxide particles for wavelengths are present in a silicon substrate are explained by the effective medium theory (Kittel "Introduction to Solid State Physics"). According to the effective medium theory, since an oxide in a substrate (medium) polarizes with respect to an external electric filed, it is considered that the medium responds to a sum of the external electric field and the polarized electric fields of the oxide.

Figure 19:
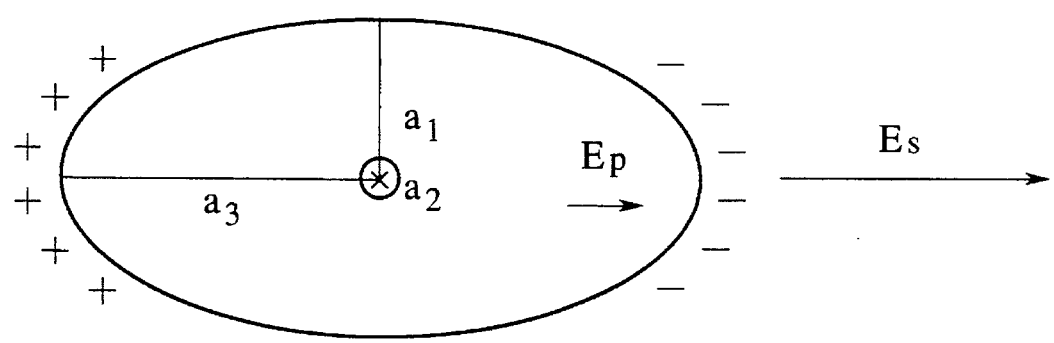
FIG. 19 is a view explaining a model of a silicon oxide film involved in Embodiment 4 of the present invention.

According to the effective medium theory, a spectrum varies in accordance with a shape of silicon oxide, a layout thereof with respect to an electric filed, a size thereof and a density thereof. The following formula can be given when, as shown in FIG. 19, silicon oxide particles each has an elliptic body having main axes respectively of lengths a1, a2, a3, and has a density f.

$$g = \frac{\epsilon_S}{L\epsilon_P + (1-L)\epsilon_S}$$

where  $L_1 + L_2 + L_3 = 1$ $$L_k = 1/a_k$$

$$\epsilon_2 = 1 + \frac{(1-f)(\epsilon_S - 1) + f(\epsilon_P - 1)g}{(1-f) + fg}$$

Figure 17:
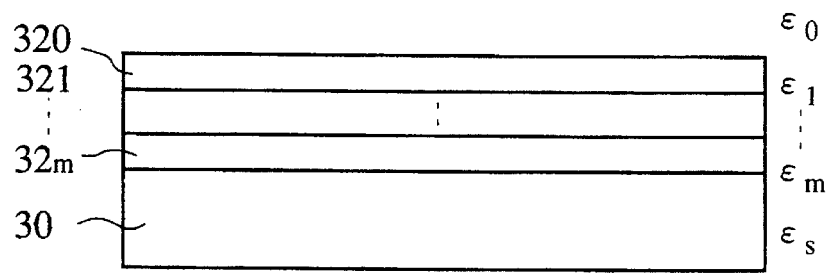
FIG. 17 is a view explaining a model of the silicon oxide film involved in Embodiment 4 of the present invention.

The effective medium theory is interpreted to be approximately applicable to interface roughness as done in the mixed layer 32b of FIG. 17. As a result, based on configurations of interface roughness, and a density and a thickness, the interface roughness can be quantized.

The procedure for quantitatively evaluating an interface structure of a silicon oxide film is as follows.

First, infrared radiation is incident on the silicon oxide film 32 on the silicon substrate 30, and spectra of reflected radiation are measured.

Then dielectric functions of the silicon substrate 30 and the silicon oxide film 32 are given by the method of the above-described Embodiment 1.

Next, unknown numbers, such as configurations and sizes of interface roughness are determined based on the actual measured infrared spectra, by an optimization algorithm, such as method of least squares.

EMBODIMENT 4-1

Figure 20:
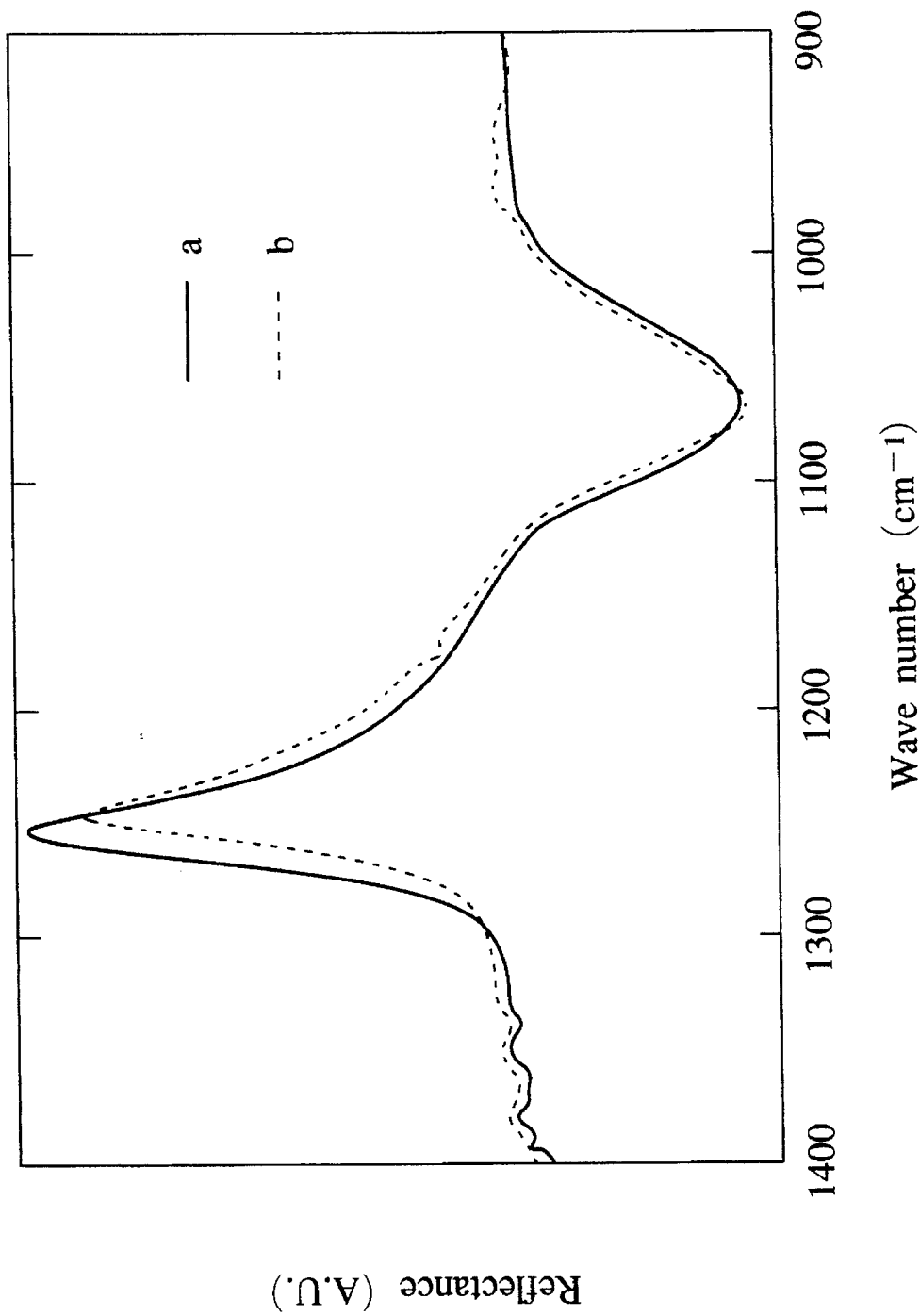
FIG. 20 is a graph of actual measured values of infrared reflection spectra of silicon oxide films on silicon substrates, the spectrum (a) being of a silicon substrate with a silicon oxide formed.

FIG. 20 shows actual measured values of infrared reflection spectra. The spectrum (a) is an infrared reflection spectrum of a thick silicon oxide film of an about 5 nm-thickness formed on a silicon substrate. The spectrum (b) is an infrared reflection spectrum of a thin silicon oxide film of an about 2 nm-thickness formed on a silicon substrate. Both silicon oxide films were formed on the same thermal oxidation conditions other than the film thickness.

In the thick silicon oxide film (spectrum (a)), the mixed layer 32b, which is interface roughness, has a low thickness ratio to a entire film thickness. The mixed layer 32b is little influential, and the interface roughness are negligible.

On the other hand, in the thin silicon oxide film (spectrum (b)), the mixed layer 32b, which is interface roughness, is influential.

Thus, in comparison with the spectrum (a) with the spectrum (b), differences between the two are considered to indicate mainly indicate the interface roughness.

In FIG. 20, in comparison of the spectrum (a) with the spectrum (b), the following differences are observed.

A first difference is that the peak by LO phonons at a 1255 $cm^{-1}$ wave number has more shifted to the side of lower wave numbers in the spectrum (b) than in the spectrum (a).

A second difference is that the spectrum (a) is more intense in a 1100–1200 $cm^{-1}$ wave number range than in the spectrum (a).

These characteristics vary depending on factors of a shape and a size of silicon oxide particles, which determine configurations of interface roughness. When values of the factors of the interface roughness derived by optimization method, based on the actual measured values of FIG. 20, a depolarization factor L=0.3, and a surface density f=0.9.

That a depolarization factor L is 0.3 indicates that a thickness-wise direction of a silicon oxide particle and a surface-wise direction thereof are substantially the same. That a surface density f is 0.9 indicates that 90% of an entire film is silicon oxide film. Accordingly a half of the thin silicon oxide film is evaluated to be an interface roughness region.

Figure 21:
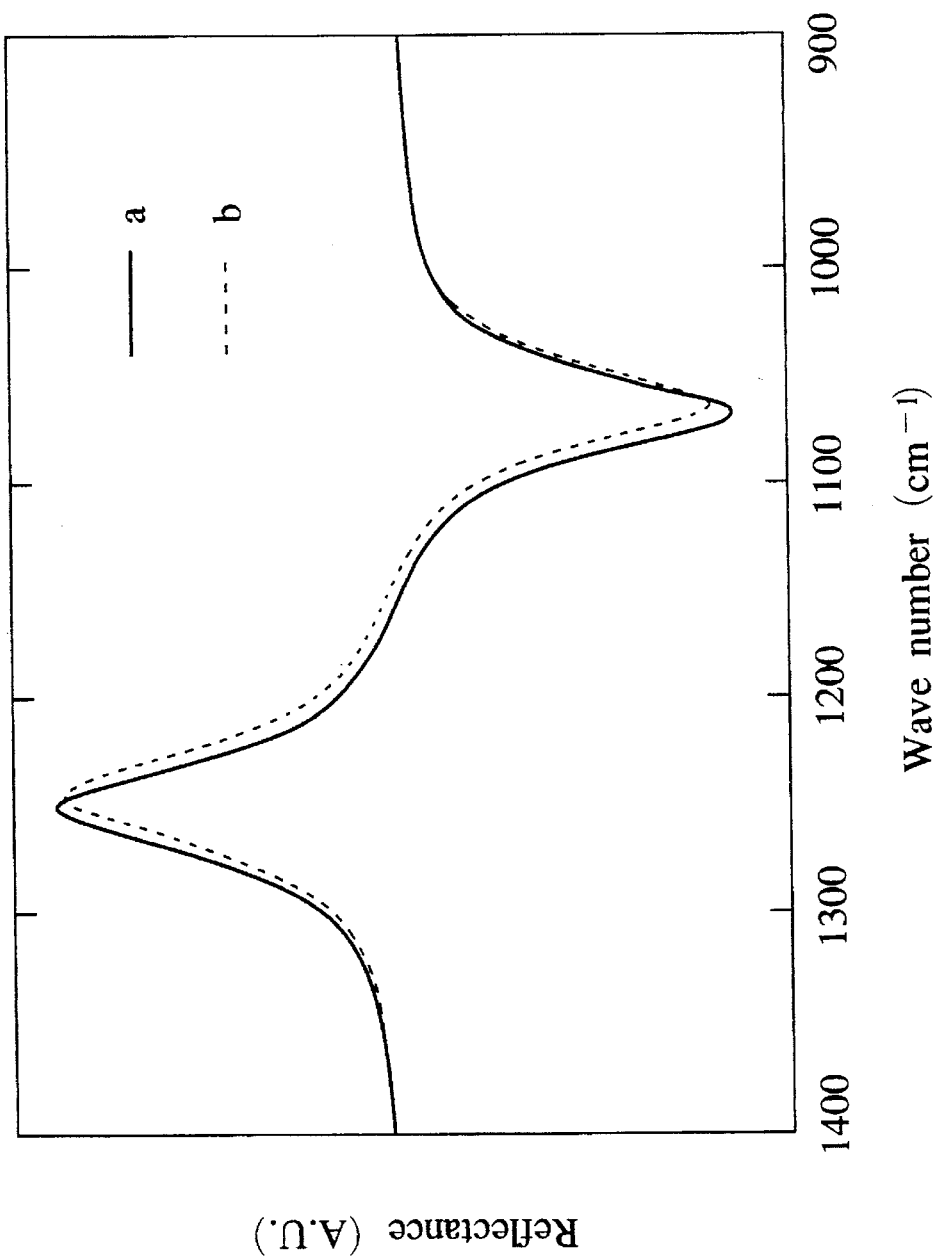
FIG. 21 is a graph of computed values of infrared reflection spectra of silicon substrates formed on silicon substrates, the spectrum (a) being of the silicon substrate and a thick silicon oxide film formed thereon, the spectrum (b) being of the silicon substrate and a thin silicon oxide film.

Based on these evaluation results, a model is set. Infrared reflection spectra computed based on the model are shown in FIG. 21. The spectrum (a) is the infrared reflection spectrum of the thick silicon oxide film. The spectrum (b) is the infrared reflection spectrum of the thin silicon oxide film.

The spectra of actual measured values of FIG. 20 substantially agree with the spectra of computed values of FIG. 21. The above-described quantitative evaluation is found proper.

EMBODIMENT 4-2

Figure 22:
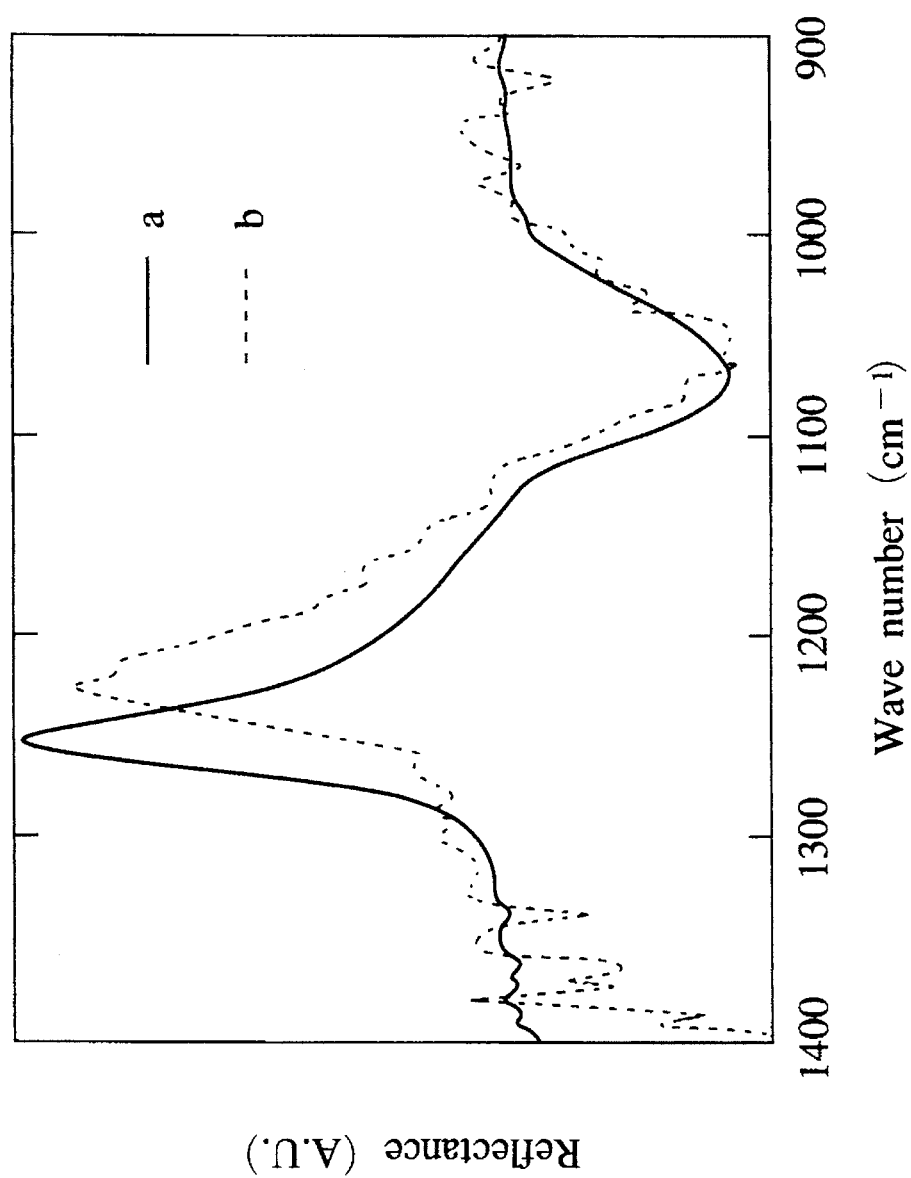
FIG. 22 is a graph of actual measured values of infrared reflection spectra of silicon oxide films formed on silicon substrates, the spectrum (a) being of a thick silicon oxide film formed on the silicon substrate, the spectrum (b) being of a thin silicon oxide film formed on the silicon substrate.

FIG. 22 shows infrared reflection spectra of actual packaging values. The spectrum (a) is infrared reflection spectrum of a thick silicon oxide film of an about 5 nm-thickness formed on a silicon substrate, The spectrum (b) is infrared reflection spectrum of a thin silicon oxide film of an about 1 nm-thickness formed on a silicon substrate. Both silicon oxide films were formed on the same thermal oxidation conditions other than film thickness.

In Embodiment 4-1 the spectrum (b) has a peak of higher intensity by LO phonons than in Embodiment 4-4, and the peak has shifted to the side of lower wave numbers.

When values of the factors of interface roughness were given in the same way as in Embodiment 4-1, a depolarization factor L=0.7, and a surface density f=0.9.

That a depolarization factor L is 0.7 means that a silicon oxide particle has a flat shape which is 5 surface-wise when it is 1 thickness-wise. That a surface density f is 0.9 means that 90% of the entire film is silicon oxide film. Thus, the substantially entire silicon oxide film is evaluated to be an interface roughness region.

Infrared absorption spectra of silicon oxide films vary under the influence of oxidation conditions, such as oxidation temperatures, oxidation atmospheres, treatments before and after their oxidation, etc. Based on such spectra, interface roughness configuration factors can be given by the same method so as to quantize interface roughness.

To compare infrared absorption spectra with each other, it is preferable to note differences between wave numbers at peaks of the spectra, differences between relative intensities of the peaks, rises between the peaks and valleys, etc.

EMBODIMENT 5

The semiconductor device fabrication apparatus according to a fifth embodiment of the present invention will be explained with reference to FIG. 23.

The silicon oxide film evaluation method according to Embodiments 1 to 4 are non-contact, nondestructive observation methods and enables observation in the normal atmospheric pressure.

The semiconductor device fabrication apparatus according to Embodiment 5 is shown in FIG. 23. This semiconductor device fabrication apparatus can practice a semiconductor device fabrication method including the evaluation step.

A heat treatment furnace 40 is provided most upstream. In the heat treatment furnace 40 heat treatments for forming thermal oxide films on silicon substrate are conducted.

An IR-RAS measuring apparatus 42 is arranged downstream of the heat treatment furnace 40 so as to continuously conduct processing. In the IR-RAS measuring apparatus 42 the silicon oxide film evaluation method according to the above-described Embodiments 1 to 3 are conducted.

A CVD apparatus 44 is arranged downstream of the IRRAS measuring apparatus 42 so as to continuously conduct processing. In the CVD apparatus 44 polycrystal silicon layers, etc. are deposited on the silicon oxide films.

Next, the operation of the semiconductor device fabrication apparatus according to Embodiment 5 will be explained by means of an example in which transistors are formed on silicon substrates.

Wafers, silicon substrates are loaded in a heat treatment furnace 40, and thin silicon oxide films as gate oxide films are formed on the surfaces of the silicon substrates.

Then, the wafers with the gate oxide films formed on are conveyed into the IR-RAS apparatus 42. There the film structures of the gate oxide films are evaluated by the method according to Embodiments 1 to 3. Those of wafers evaluated to be defective are rejected on this stage. Accordingly it is not necessary to process the defective wafers wastefully any further, with a result of improved fabrication efficiency.

Those of the wafers evaluated to be good are conveyed into the CVD apparatus 44, and there polycrystal silicon films as gate electrodes are deposited on the gate oxide films.

Thus according to Embodiment 5, the gate oxide films can be evaluated on-line immediately after formed on the silicon substrates, and based on results of the evaluation, heat treatment conditions, etc. can be efficiently optimized.

What is claimed is:

1. A silicon oxide film evaluation method comprising the steps of:

measuring reflectance or absorption spectra of a silicon oxide film, said silicon oxide film having a bulk region and an interface region formed on a silicon substrate by IR-RAS; and evaluating a structure of the interface region between the silicon substrate and the silicon oxide film based on the reflectance or absorption spectra in a range between a peak of the spectra by TO phonons around 1100 $cm^{-1}$ and a peak of the spectra by LO phonons around 1230 $cm^{-1}$, said range excluding the peaks of the spectra by the TO phonons and the LO phonons.

2. A silicon oxide film evaluation method according to claim 1, wherein in the measuring step, an incident radiation is polarized with respect to an incident surface of the silicon oxide film.

3. A silicon oxide film evaluation method according to claim 1, wherein in the measuring step, an incident radiation is incident on the surface of the silicon oxide film slantly thereto.

4. A silicon oxide film evaluation method according to claim 3, wherein in the measuring step, an incident angle of the incident radiation is in a range of 40° to 80°.

5. A silicon oxide film evaluation method according to claim 1, wherein a silicon oxide film formed on a surface of the silicon substrate opposite to a surface where the silicon oxide film to be evaluated is formed on is removed after forming the silicon oxide film to be evaluated and before measuring reflectance or absorption spectra of the silicon oxide film to be evaluated.

6. A silicon oxide film evaluation method according to claim 5, wherein the silicon oxide film to be evaluated is a thermal oxide film formed by heating the silicon substrate in an oxidation atmosphere.

7. A silicon oxide film evaluation method according to claim 5, wherein the silicon oxide film to be evaluated is a natural oxide film.

8. A silicon oxide film evaluation method according to claim 5, wherein an infrared absorbing region for absorbing infrared radiation is provided in the silicon substrate.

9. A silicon oxide film evaluation method according to claim 5, wherein a model is set, in which a mixed layer where silicon particles and silicon oxide particles are mixed is present on an interface between the silicon substrate and the silicon oxide film, and a dielectric function of the mixed layer is calculated from effective medium theory, and the dielectric function of the silicon oxide film computed based on the reflectance spectra is compared with the dielectric function calculated from the effective medium theory, and said model comprises the silicon substrate, the mixed layer on the silicon substrate, and the silicon oxide film on the mixed layer.

10. A semiconductor device fabrication method comprising a step of evaluating a silicon oxide film by the silicon oxide film evaluation method according to claim 5.

11. A semiconductor device fabrication method comprising the steps of:

forming a silicon oxide film on a silicon substrate by thermal oxidation;

evaluating the silicon oxide film formed on the silicon substrate by the silicon oxide film evaluation method according to claim 5; and depositing a polycrystal silicon layer on the silicon oxide film.

12. A silicon oxide film evaluation method according to claim 1, wherein the silicon oxide film to be evaluated is a thermal oxide film formed by heating the silicon substrate in an oxidation atmosphere.

13. A silicon oxide film evaluation method according to claim 1, wherein the silicon oxide film to be evaluated is a natural oxide film.

14. A silicon oxide film evaluation method according to claim 1, wherein an infrared absorbing region for absorbing infrared radiation is provided in the silicon substrate.

15. A silicon oxide film evaluation method according to claim 1, wherein a model is set, in which a mixed layer where silicon particles and silicon oxide particles are mixed is present on an interface between the silicon substrate and the silicon oxide film, and a dielectric function of the mixed layer is calculated from effective medium theory, and the dielectric function of the silicon oxide film computed based on the reflectance spectra is compared with the dielectric function calculated from the effective medium theory, and said model comprises the silicon substrate, the mixed layer on the silicon substrate, and the silicon oxide film on the mixed layer.

16. A semiconductor device fabrication method comprising a step of evaluating a silicon oxide film by the silicon oxide film evaluation method according to claim 1.

17. A semiconductor device fabrication method comprising the steps of:

forming a silicon oxide film on a silicon substrate by thermal oxidation;

evaluating the silicon oxide film formed on the silicon substrate by the silicon oxide film evaluation method according to claim 1; and depositing a polycrystal silicon layer on the silicon oxide film.

* * * * *